United States Patent
Mikawa et al.

(10) Patent No.: US 7,915,656 B2
(45) Date of Patent: Mar. 29, 2011

(54) NONVOLATILE SEMICONDUCTOR MEMORY APPARATUS AND MANUFACTURING METHOD THEREOF

(75) Inventors: Takumi Mikawa, Shiga (JP); Takeshi Takagi, Kyoto (JP)

(73) Assignee: Panasonic Corporation, Osaka (JP)

( * ) Notice: Subject to any disclaimer, the term of this patent is extended or adjusted under 35 U.S.C. 154(b) by 189 days.

(21) Appl. No.: 12/446,964

(22) PCT Filed: Oct. 22, 2007

(86) PCT No.: PCT/JP2007/070546
§ 371 (c)(1),
(2), (4) Date: Apr. 23, 2009

(87) PCT Pub. No.: WO2008/050716
PCT Pub. Date: May 2, 2008

(65) Prior Publication Data
US 2010/0051892 A1    Mar. 4, 2010

(30) Foreign Application Priority Data

Oct. 24, 2006    (JP) ................................. 2006-288577

(51) Int. Cl.
*H01L 27/108* (2006.01)
*H01L 29/76* (2006.01)
*H01L 29/94* (2006.01)
*H01L 31/119* (2006.01)
*H01L 21/20* (2006.01)

(52) U.S. Cl. ........ 257/296; 257/300; 257/298; 257/306; 438/396; 438/253; 438/381

(58) Field of Classification Search ................. 257/3, 43, 257/758, 2, 536, 379, 306, 296, 298, 303, 257/905, 906, 907, 908; 438/104, 720, 722, 382, 200, 210, 239, 250, 253, 256, 381, 393, 396

See application file for complete search history.

(56) References Cited

U.S. PATENT DOCUMENTS

| | | | |
|---|---|---|---|
| 7,037,749 B2 * | 5/2006 | Horii et al. ...................... | 438/95 |
| 7,642,622 B2 * | 1/2010 | Yi et al. ......................... | 257/613 |
| 7,767,491 B2 * | 8/2010 | Horii et al. .................... | 438/102 |
| 7,791,119 B2 * | 9/2010 | Odagawa et al. ............. | 257/295 |
| 2004/0085833 A1 | 5/2004 | Hwang et al. | |
| 2004/0188742 A1 | 9/2004 | Honma et al. | |
| 2006/0063279 A1 | 3/2006 | Honma et al. | |

(Continued)

FOREIGN PATENT DOCUMENTS

JP    2001-217397    8/2001

(Continued)

*Primary Examiner* — Chuong A. Luu
(74) *Attorney, Agent, or Firm* — McDermott Will & Emery LLP

(57) ABSTRACT

A nonvolatile semiconductor memory apparatus (10) of the present invention comprises a semiconductor substrate (11), an active element forming region provided on the semiconductor substrate (11) and including a plurality of active elements (12), a wire forming region which is provided on the active element forming region to electrically connect the active elements (12) and includes plural layers of semiconductor electrode wires (15, 16), a memory portion forming region (100) which is provided above the wire forming region and provided with memory portions (26) arranged in matrix, a resistance value of each of the memory portions changing according to electric pulses applied, and an oxygen barrier layer (17) which is provided between the memory portion forming region (100) and the wire forming region so as to extend continuously over at least an entire of the memory portion forming region (100).

15 Claims, 15 Drawing Sheets

U.S. PATENT DOCUMENTS

2006/0081961 A1    4/2006    Tanaka et al.

FOREIGN PATENT DOCUMENTS

| | | |
|---|---|---|
| JP | 2003-068984 | 3/2003 |
| JP | 2004-071700 | 3/2004 |
| JP | 2004-158852 | 6/2004 |
| JP | 2004-303990 | 10/2004 |
| JP | 2004-311974 | 11/2004 |
| JP | 2004-363604 | 12/2004 |
| JP | 2005-347468 | 12/2005 |
| JP | 2006-080259 | 3/2006 |
| JP | 2006-120707 | 5/2006 |
| WO | WO 2006/109622 A1 | 10/2006 |

* cited by examiner

NONVOLATILE SEMICONDUCTOR MEMORY APPARATUS AND MANUFACTURING METHOD THEREOF

RELATED APPLICATIONS

This application is the U.S. National Phase under 35 U.S.C. §371 of International Application No. PCT/JP2007/070546, filed on Oct. 22, 2007, which in turn claims the benefit of Japanese Application No. 2006-288577, filed on Oct. 24, 2006, the disclosures of which Applications are incorporated by reference herein.

TECHNICAL FIELD

The present invention relates to a nonvolatile semiconductor memory apparatus configured to store data using a material whose resistance value reversibly changes according to electric pulses applied, and a manufacturing method thereof.

BACKGROUND ART

In recent advancement of digital technologies in electronic hardware, larger-capacity and nonvolatile semiconductor memory apparatuses have been vigorously developed in order to store data of music, images, information and so on. For example, nonvolatile semiconductor memory apparatuses using ferroelectric substances as capacitive elements are now used in various fields. However, the ferroelectric substances in a film state have very small residual polarization values and therefore require thermal treatment in an oxygen atmosphere to improve a hysteresis characteristic. In the thermal treatment, metal wires in a wire forming region provided under the ferroelectric substance is oxidized by oxygen diffusing through an interlayer insulating layer, causing a problem in achievement of further miniaturization and higher density in the future.

Under the circumstances, a nonvolatile semiconductor memory apparatus is disclosed, which is manufactured by a manufacturing method including a step for forming an anti-oxidation film after forming a metal wire in an uppermost layer in a wire forming region in which a multi-layer wire layer is formed, a step for forming a ferroelectric substance after forming the anti-oxidation film, and a step for performing thermal treatment in an oxygen atmosphere after forming the ferroelectric substance (see patent document 1).

FIG. 14 is a cross-sectional view of a nonvolatile semiconductor memory apparatus using the ferroelectric substance illustrated in this example as a memory portion. As shown in FIG. 14, transistors 72 each of which is comprised of a source region 72a, a drain region 72b, a gate insulating film 72c and a gate electrode 72d are provided on a semiconductor substrate 71. First electrode wires 73a are provided on a first interlayer insulating layer 74a and connected to transistors 72 via their associated through-conductors 75a, respectively.

In this case, the electrode wires are formed in a multi-layer form. On the first electrode wire 73a, a second interlayer insulating layer 74b, a second electrode wire 73b, and a third interlayer insulating layer 74c are sequentially provided. In addition, on the third interlayer insulating layer 74c, an anti-oxidation film 76 and a fourth interlayer insulating layer 74d are provided. Further, in specified regions on the fourth interlayer insulating layer 74d, ferroelectric capacitors 80 each including a lower electrode 77, a ferroelectric film 78 and an upper electrode 79 are provided. A metal wire 82 connected with the upper electrode 79 of each ferroelectric capacitor 80 is provided with the second interlayer insulating layer 81 interposed therebetween.

The ferroelectric capacitor 80 is entirely subjected to thermal treatment in an oxygen atmosphere after formation. The anti-oxidation film 76 serves to prevent the oxidation of the electrode wires formed under the ferroelectric capacitor 80 by the thermal treatment in such an oxygen atmosphere. However, the lower electrode wires 77 of the ferroelectric capacitors 80 are connected to the second electrode wires 73b via the through-conductors 75c, while the through-conductors 75c are provided to penetrate through the anti-oxidation film 76 immediately under the ferroelectric capacitors 80. Therefore, the anti-oxidation film 76 has a structure separated by these through-conductors 75c and is relatively difficult to provide a sufficient oxygen blocking property.

Furthermore, in contrast to the nonvolatile memory apparatus using the ferroelectric capacitors, in recent years, a nonvolatile semiconductor memory apparatus (hereinafter referred to as ReRAM) using a material whose resistance value changes according to electric pulses applied and continues to keep its state has attracted an attention because it can easily have compatibility with a normal semiconductor process.

For example, there is disclosed an apparatus configuration, for enabling the use of the existing DRAM step as it is, in a ReRAM including one transistor and one memory portion. The ReRAM includes transistors and nonvolatile memory portions connected to drains of the transistors. The memory portion has a structure in which a resistance variable layer whose resistance reversibly changes according to current pulses applied is sandwiched between an upper electrode and a lower electrode. As the resistance variable layer, a nickel oxide layer (NiO), a vanadium oxide layer ($V_2O_5$), a zinc oxide layer (ZnO), a niobium oxide layer ($Nb_2O_5$), a titanium oxide layer ($TiO_2$), a tungsten oxide layer ($WO_3$), a cobalt oxide layer (CoO), etc is used. It is known that the transition metal oxide is allowed to have a specified resistance value by application of a voltage or current having a threshold or higher and to hold its resistance value until the transition metal oxide is newly applied with a voltage or current. And the transition metal oxide can be manufactured using the existing DRAM step as it is (e.g., patent document 2).

The second example includes one transistor and one nonvolatile memory portion. Also, a cross-point type nonvolatile semiconductor memory apparatus using a perovskite structure material is also disclosed (see, e.g., patent document 3). This nonvolatile memory apparatus has a structure in which stripe-shaped lower electrodes are provided on a substrate and an active layer is provided so as to cover the entire surface of the lower electrodes. As the active layer, a resistance variable layer whose resistance reversibly changes according to electric pulses is used. On the active layer, stripe-shaped upper electrodes are provided to respectively cross the lower electrodes at a right angle. A region where each of the lower electrodes and each of the upper electrodes cross each other such that the active layer is sandwiched between the lower electrode and the upper electrode forms a memory portion. The lower electrodes and the upper electrodes serve as word lines or bit lines. With such a cross-point configuration, a larger capacity is attainable.

Patent document 1: Japanese Laid-Open Patent Application Publication No. 2001-217397
Patent document 2: Japanese Laid-Open Patent Application Publication No. 2004-363604
Patent document 3: Japanese Laid-Open Patent Application Publication No. 2003-68984

DISCLOSURE OF THE INVENTION

Problems to be Solved by the Invention

The first example has a problem that since the through-conductor is provided to penetrate through the anti-oxidation film immediately under the ferroelectric capacitor, oxygen diffuses from a gap region where the through-conductor is provided to the multi-layer wire layer and the electrode wires are oxidized in the step for forming the ferroelectric film or in the thermal treatment in the oxygen atmosphere after forming the ferroelectric capacitor.

In contrast, in the second example and the third example, a characteristic fluctuation due to the oxidation of the electrode wire and the interlayer insulating layer of a low dielectric constant provided under the resistance variable layer is not taken into account. For the second example and the third example, the anti-oxidation film shown in the first example may be possibly used. But, in the first example, the through-conductor is provided in the anti-oxidation film under the region where the ferroelectric film is present. For this reason, oxygen in some cases comes off from the resistance variable layer which is easily oxidized and reduced, and diffuses through the through-conductor in subsequent steps. For the purpose of achieving higher density and further miniaturization for the apparatus including the memory portions, the electrode wires are required to have low resistance and the interlayer insulating layer is required to be formed of a low dielectric constant material. These materials are typically damaged due to oxidation by oxygen. In light of this, it is an important objective to attain a configuration and process which are highly compatible with the conventional semiconductor process without oxidizing these materials.

The present invention is directed to solving the problems associated with the prior arts, and an object of the present invention is to provide a nonvolatile semiconductor memory apparatus which is capable of preventing a damage to a semiconductor electrode wire and an interlayer insulating layer in a wire forming region which would be caused by diffusion of oxygen in a forming step of a resistance variable layer and its subsequent steps, and of attaining higher density and miniaturization, and a manufacturing method thereof.

Means for Solving the Problem

In order to achieve the above objective, a nonvolatile semiconductor memory apparatus of the present invention comprises a semiconductor substrate; an active element forming region provided on the semiconductor substrate and including a plurality of active elements; a wire forming region which is provided on the active element forming region to electrically connect the active elements and includes a semiconductor electrode wire and a wire region insulating layer covering the semiconductor electrode wire; a memory portion forming region which is provided above the wire forming region and provided with memory portions arranged in matrix, a resistance value of each of the memory portions changing according to electric pulses applied, the memory portion forming region including an upper electrode wire, a resistance variable layer, a lower electrode wire, and a memory region insulating layer covering the upper electrode wire, the resistance variable layer, and the lower electrode wire; and an oxygen barrier layer which is interposed between the memory portion forming region and the wire forming region and extends continuously over an entire of the memory portion forming region to block oxygen for at least the entire of the memory portion forming region.

As used herein, the above identified term "memory portion forming region" means a region surrounded by an outer periphery of the resistance variable layer of the memory portion, when the "memory portion forming region" is viewed from above. To be specific, when a single resistance variable layer is provided as described later, the "memory portion forming region" in some cases corresponds to a region surrounded by the outer periphery of the single resistance variable layer. Or, when a plurality of resistance variable layers are provided, the "memory portion forming region" in some cases corresponds to a region surrounding by the shortest line and in the annular form, the outer periphery of the resistance variable layers arranged at an outermost side.

In such a configuration, the wire forming region and the memory portion forming region can be disconnected by the oxygen barrier layer. Therefore, it is possible to surely prevent the damage to the wire forming region due to diffusion or the like of oxygen generated in the step for forming the memory portion forming region. For example, even in the case where copper is used for the semiconductor electrode wire in the wire forming region and fluorine-containing oxide or the like is used for the interlayer insulating layer, a stable manufacturing process is attainable.

In the above configuration, an insulating material used for the wire region insulating layer may have a dielectric constant smaller than a dielectric constant of an insulating material used for the memory region insulating layer.

In such a configuration, a circuit operation associated with wire delay is prevented by reducing a parasitic capacitance between semiconductor electrode wires. As a result, a nonvolatile semiconductor memory apparatus which is capable of a high-speed operation is attainable.

In the above configuration, the lower electrode wires may be formed in a stripe shape above the wire forming region via a first insulating layer serving as the memory region insulating layer. The resistance variable layer may be provided on the first insulating layer including the lower electrode wires. The upper electrode wires may be formed in a stripe shape on the resistance variable layer so as to respectively cross the lower electrode wires. The memory portions may be each constituted by the lower electrode wire, the resistance variable layer, and the upper electrode wire corresponding to a region where the lower electrode wire and the upper electrode wire cross each other. When a single resistance variable layer is provided, a region surrounded by an outer periphery of the single resistance variable layer may correspond to the memory portion forming region, and when a plurality of resistance variable layers are provided, a region surrounding by a shortest line and in an annular form an outer periphery of the resistance variable layers arranged at an outermost side may correspond to the memory portion forming region.

In this case, the lower electrode wires and the upper electrode wires may be respectively connected to semiconductor electrode wires in a region different from the memory portion forming region.

In such a configuration, since the contact holes and the like penetrating through the oxygen barrier layer are not provided under the region where the resistance variable layer is provided, it is possible to effectively prevent diffusion or the like of oxygen to the wire forming region, even when using the resistance variable layer made of an iron-based oxide which is easily oxidized and reduced.

In the above configuration, the lower electrode wires may be formed in a stripe shape above the wire forming region via a first insulating layer serving as the memory region insulating layer interposed between the lower electrode wires and the wire forming region. Resistance variable layers may be embedded to fill contact holes formed in an interlayer insulating layer serving as the memory region insulating layer such that the resistance variable layers are respectively connected to the lower electrode wires. The upper electrode wires may be formed in a stripe shape on the interlayer insulating layer such that the upper electrode wires are respectively connected to the resistance variable layer and respectively cross the lower electrode wires. The memory portions may be each constituted by the lower electrode wire, the resistance variable layer, and the upper electrode wire corresponding to a region where the lower electrode wire and the upper electrode wire cross each other. When the resistance variable layers are arranged like islands to respectively correspond to the memory portions in a planar view, a region surrounding by a shortest line and in an annular form an outer periphery of the resistance variable layers arranged at an outermost side may correspond to the memory portion forming region.

In such a configuration, since the contact holes and the like penetrating through the oxygen barrier layer under the memory portion forming region are not provided and the oxygen barrier layer is formed to extend continuously in the cross-point configuration, it is possible to effectively prevent diffusion or the like of oxygen to the wire forming region, even when using the resistance variable layer made of an iron-based oxide which is easily oxidized and reduced.

The nonvolatile semiconductor memory apparatus may further comprise an oxygen barrier separating film which is provided inside each of the contact holes such that the oxygen barrier separating film is interposed between the resistance variable layer and the interlayer insulating layer. In this case, the memory apparatus may further comprise a second oxygen barrier layer provided between the interlayer insulating layer and the upper electrode wires. Further, the second oxygen barrier layer may be made of a material forming the oxygen barrier separating film.

In such a configuration, even in the case where the interlayer insulating layer is formed of, for example, fluorine-containing oxide, it is possible to prevent diffusion of oxygen into the interlayer insulating layer in the step for forming the resistance variable layer or in its subsequent steps. Therefore, it is possible to prevent an event that the interlayer insulating layer is oxidized and characteristics such as a dielectric constant fluctuate.

In the above configuration, plural layers of the memory portion forming regions may be stacked to form a layer structure above the wire forming region. In such a configuration, a nonvolatile semiconductor memory apparatus having memory portions with a very large capacity is attainable using the interlayer insulating layer with a low dielectric constant and the semiconductor electrode wires and the like formed of copper.

In the above configuration, the lower electrode wires and the upper electrode wires may be connected to the semiconductor electrode wires in a region different from the memory portion forming region. In such a configuration, it is not necessary to provide an embedded electric conductor having a shape penetrating through the oxygen barrier layer under the memory portion forming region, and therefore, a more desirable oxygen barrier property is attainable.

In the above configuration, the nonvolatile semiconductor memory apparatus may further comprise wire insulating layers which are respectively provided between adjacent lower electrode wires and between adjacent upper electrode wires and are serving as the memory region insulating layer. An insulating material used for at least one of the wire insulating layers may have a dielectric constant smaller than a dielectric constant of an insulating material used for the interlayer insulating layer. Also, the lower electrode wires may be embedded in the first insulating layer such that main surfaces thereof are exposed. The first insulating layer may be the wire insulating layer provided between adjacent lower electrode wires.

In the above configuration, at least one of an interval between adjacent lower electrode wires and an interval between adjacent upper electrode wires may be smaller than a thickness of the interlayer insulating layer.

In such a configuration, the parasitic capacitance between the lower electrode wires or between adjacent upper electrode wires is reduced and the occurrence of the cross talk can be suppressed. Furthermore, the memory portions can be formed with high density by reducing the interval between the lower electrode wires or between the upper electrode wires, while reducing the parasitic capacitance and suppressing occurrence of the cross talk.

In the above configuration, the resistance variable layer may be made of a material which is an oxide containing iron. In such a configuration, it is possible to prevent diffusion or the like of oxygen to the wire forming region and to use the resistance variable layer which is stable in resistance varying characteristics and is highly reproducible. As a result, a nonvolatile semiconductor memory apparatus which has a high manufacturing yield and favorable characteristics is attainable.

In the above configuration, the interlayer insulating layer may be silicon oxide layer formed using a tetraethyloxysilane-ozone based gas, or fluorosilicate glass. The wire insulating layer may be silicon carbon nitride layer or silicon oxycarbite layer. In such a configuration, since the parasitic capacitance between the wires in the memory portion forming region can be reduced, the memory portion can be formed to have a higher-density construction.

In the above configuration, the oxygen barrier layer may be formed of a silicon nitride layer, a silicon oxynitride later, an alumina layer, a tantalum oxide layer, a titanium oxide layer, a hafnium oxide layer or a zircon oxide layer. In such a configuration, the film with an excellent oxygen barrier property can be formed easily.

A method of manufacturing a nonvolatile semiconductor memory apparatus of the present invention comprises a step for forming an active element forming region including a plurality of active elements on a semiconductor substrate; a step for forming a wire forming region on the active element forming region to electrically connect the active elements such that plural layers of semiconductor electrode wires and a wire region insulating layer covering the semiconductor electrode wires are formed; a step for forming an oxygen barrier layer on the wire forming region; and a step for forming a memory portion forming region on the oxygen barrier layer, including forming lower electrode wires, forming resistance variable layers on the lower electrode wires, forming upper electrode wires on the resistance variable layers; and forming a memory region insulating layer covering the lower electrode wires, the resistance variable layers and the upper electrode wires to arrange memory portions in matrix, a resistance value of the memory portions changing according to electric pulses applied. In the step for forming the oxygen barrier layer, the oxygen barrier layer is formed to extend continuously over at least an entire of the memory portion forming region.

In such a method, since the oxygen barrier layer is capable of disconnecting the wire forming region from the memory portion forming region, it is possible to surely prevent damage to the wire forming region due to oxygen generated in the step for forming the memory portion forming region and its subsequent steps.

In the above method, the step for forming the memory portion forming region may include a step for forming a first insulating layer serving as the memory region insulating layer; a step for forming stripe-shaped lower electrode wires on the first insulating layer; a step for forming a resistance variable layer covering the lower electrode wires and the first insulating layer; and a step for forming stripe-shaped upper electrode wires on the resistance variable layer so as to respectively cross the lower electrode wires; wherein when a single resistance layer is formed in the step for forming the resistance variable layer, a region surrounded by an outer periphery of the single resistance layer corresponds to the memory portion forming region, and when a plurality of resistance variable layers are formed in the step for forming the resistance variable layer, a region surrounding by a shortest line and in an annular form an outer periphery of the resistance variable layers arranged at an outermost side corresponds to the memory portion forming region.

In this case, the lower electrode wires and the upper electrode wires may be connected to the semiconductor electrode wires in a region different from the memory portion forming region.

In such a method, even in the case where the resistance variable layer is formed to extend continuously over a large area so as to couple the memory portions, it is possible to effectively suppress diffusion of oxygen generated in the step after the step for forming he resistance variable layer, to the wire forming region.

In the above method, the step for forming the memory portion forming region may include a step for forming a first insulating layer serving as the memory region insulating layer; a step for forming stripe-shaped lower electrode wires on the first insulating layer; a step for forming an interlayer insulating layer serving as the memory region insulating layer so as to cover the lower electrode wires and the first insulating layer; a step for forming contact holes above the oxygen barrier layer and in the interlayer insulating layer on the lower electrode wires such that the lower electrode wires are exposed; a step for embedding the resistance variable layers to fill the contact holes such that the resistance variable layers are respectively connected to the lower electrode wires; and a step for forming stripe-shaped upper electrode wires on the interlayer insulating layer such that the upper electrode wires are respectively connected to the resistance variable layers and respectively cross the lower electrode wires. When the resistance variable layers are formed like islands so as to respectively correspond to regions where the lower electrode wires cross the upper electrode wires in the step for embedding the resistance variable layers, a region surrounding by a shortest line and in an annular form an outer periphery of the resistance variable layers arranged at an outermost side may correspond to the memory portion forming region.

In such a method, it is possible to effectively suppress damage to the wire forming region even when oxygen or the like is generated in the step for forming the interlayer insulating layer or the resistance variable layer or its subsequent steps.

In the above method, the step for forming the memory portion forming region may further include a step for providing an oxygen barrier separating film between the resistance variable layer and the interlayer insulating layer in formation of each of the contact holes.

In such a method, even when using the interlayer insulating layer made of, for example, fluorine-containing oxide, it is possible to effectively prevent the damage to the interlayer insulating layer by oxygen resulting from reduction of the resistance variable layer, because of the presence of the oxygen barrier separating film provided between the resistance variable layer and the interlayer insulating layer.

In the above method, the lower electrode wires and the upper electrodes wire may be connected to semiconductor electrode wires in a region different from the memory portion forming region. In such a method, electric connection can be established between the memory portion in the memory portion forming region and the semiconductor electrode wires in the wire forming region while disconnecting the wire forming region from the memory portion forming region by using the oxygen barrier layer.

The above method may further comprise a step for repeating the step for forming the memory portion forming region to stack above the wire forming region plural layers of the memory portion forming regions. In such a method, it is possible to stack the memory portion forming regions while surely disconnecting the wire forming region from the memory portion forming region by using the oxygen barrier layer. As a result, a nonvolatile semiconductor memory apparatus which has a high yield, is highly reproducible, and has a large memory capacity is easily attainable.

In the above method, the resistance variable layer may be made of a material which is an oxide containing iron. In such a method, it is possible to prevent diffusion or the like of oxygen to the wire forming region and to use the resistance variable layer which has favorable resistance varying characteristics and is highly reproducible. As a result, a nonvolatile semiconductor memory apparatus which has a high manufacturing yield and favorable characteristics is attainable.

In the above method, the interlayer insulating layer may be silicon oxide layer formed using a tetraethyloxysilane-ozone based gas or fluorosilicate glass. As a material used for at least one of the wire insulating layers formed between adjacent lower electrode wires and between adjacent upper electrode wires, a material having a dielectric constant smaller than a dielectric constant of a material used for the interlayer insulating layer may be used. The first insulating layer may be silicon carbon nitride layer or silicon oxycarbite layer. The wire insulating layer may be silicon carbon nitride layer or silicon oxycarbite layer.

In such a method, since parasitic capacitance between the stripe-shaped lower electrode wires, between the stripe-shaped upper electrode wires, or between the lower electrode wire and the upper electrode wire can be reduced. As a result, a higher density and further miniaturization are attainable.

In the above method, the oxygen barrier layer may be formed of a silicon nitride layer, a silicon oxynitride later, an alumina layer, a tantalum oxide layer, a titanium oxide layer, a hafnium oxide layer or a zircon oxide layer. By using such materials, the film with an excellent oxygen barrier property can be formed easily.

The above and further objects, features and advantages of the present invention will more fully be apparent from the following detailed description of preferred embodiments with accompanying drawings.

Effects of the Invention

The nonvolatile semiconductor memory apparatus of the present invention provides a great advantage that, since the oxygen barrier layer is provided between the wire forming region and the memory portion forming region, the semiconductor electrode wires or the interlayer insulating layer in the wire forming region is not damaged by oxygen generated in the step for forming the memory portion forming region or its subsequent steps, and thus a nonvolatile semiconductor memory apparatus which is stable and has a high manufacturing yield is attainable.

Figure 1:
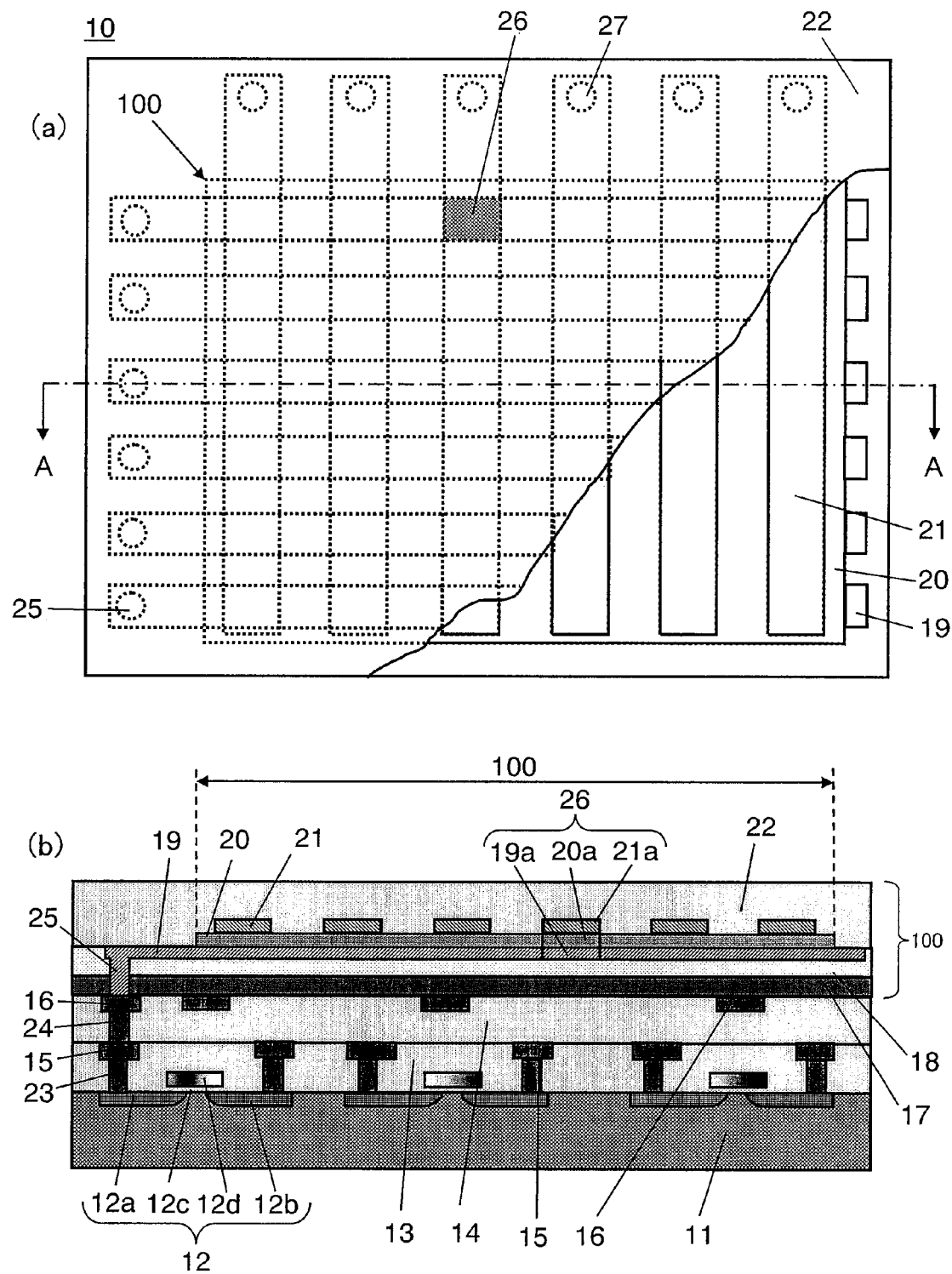
FIG. 1(a) is a plan view showing a configuration of a nonvolatile semiconductor memory apparatus according to Embodiment 1 of the present invention.
FIG. 1(b) is a cross-sectional view taken in the direction of arrows along line A-A.

DESCRIPTION OF REFERENCE NUMBERS 10, 40, 50, 65 nonvolatile semiconductor memory apparatus (ReRAM)
11, 71 semiconductor substrate
12 active element
12a, 72a source region
12b, 72b drain region
12c, 72c gate insulating film
12d, 72d gate electrode
13, 14 semiconductor interlayer insulating layer
15, 16 semiconductor electrode wire
17 oxygen barrier layer
18, 41 first insulating layer
19, 19a, 43, 43a lower electrode wire
20, 20a, 44, 53, 58 resistance variable layer
21, 21a, 45, 45a, 54, 59 upper electrode wire
22, 41, 46, 51, 56, 60 wire insulating layer
23, 24, 25, 27, 55 embedded electric conductor
26, 47 memory portion
28 groove
29, 48 contact hole
42, 52, 57, 81 interlayer insulating layer
66 oxygen barrier separating film
67 second oxygen barrier layer
68 thin film
72 transistor
73a first electrode wire
73b second electrode wire
74a first interlayer insulating layer
74b second interlayer insulating layer
74c third interlayer insulating layer
74d fourth interlayer insulating layer
75a, 75b, 75c through-conductor
76 anti-oxidation film
77 lower electrode
78 ferroelectric film
79 upper electrode
80 ferroelectric capacitor
82 metal wire
100 memory portion forming region

BEST MODE FOR CARRYING OUT THE INVENTION

Hereinafter, embodiments of the present invention will be described with reference to the drawings. The same components or constituents are identified by the same reference numbers and will not be described repetitively in some cases. In addition, the shapes of transistors, memory portions and others are schematically shown and the numbers of them are set for easier illustration.

Embodiment 1

FIG. 1 is a view showing a configuration of a nonvolatile semiconductor memory apparatus 10 according to Embodiment 1 of the present invention. FIG. 1(a) is a plan view. FIG. 1(b) is a cross-sectional view taken in the direction of arrows along line A-A. In the plan view of FIG. 1(a), a part of an insulating protective film 22 corresponding to an uppermost layer is illustrated as being cut away for easier understanding.

As shown in FIG. 1, a nonvolatile semiconductor memory apparatus 10 of this embodiment comprises an active element forming region including a semiconductor substrate 11 and a plurality of active elements 12 provided on the semiconductor substrate 11, a wire forming region which is provided on the active element forming region to electrically connect the active elements 12 and includes plural layers of semiconductor electrode wires 15 and 16, a memory portion forming region 100 provided on the wire forming region, in which memory portions 26 whose resistance values change according to electric pulses applied are arranged in matrix, and an oxygen barrier layer 17 which is provided between the memory portion forming region 100 and the wire forming region and extends continuously over at least the entire of the memory portion forming region 100 to block oxygen for the entire of memory portion forming region 100.

The active element forming region refers to a region in which three active elements 12 are arranged in FIG. 1, although it is not identified by a reference number. Also, the wire forming region refers to a region comprised of the semiconductor electrode wires 15 and 16 and semiconductor interlayer insulating layers 13 and 14 (wire region insulating layer) covering and electrically insulating the semiconductor electrode wires 15 and 16, although it is not identified by a reference number in the same manner. Whereas as shown in FIG. 1, the semiconductor electrode wires 15 and 16 in the wire forming region are formed by two layers and the semiconductor insulating layers 13 and 14 in the wire forming region are formed by two layers, they are not limited to two layers but may be formed by three or more layers. In this embodiment, the dielectric constant of the insulating material used for the semiconductor insulating layers 13 and 14 is smaller than the dielectric constant of the insulating material used for the memory region insulating layer (e.g., first insulating layer 18 described later) in the memory portion forming region 100. This makes it possible to reduce a parasitic capacitance between the semiconductor interlayer insulating layers 13 and 14 in the wire forming region. Therefore, a circuit operation associated with wire delay can be prevented, and thus the nonvolatile semiconductor memory apparatus 10 is able to operate at a high speed.

In the nonvolatile semiconductor memory apparatus 10 of this embodiment, the memory portion forming region 100 is configured as follows. To be specific, the memory portion forming region 100 includes stripe-shaped lower electrode wires 19 provided above the wire forming region, with the first insulating layer 18 interposed therebetween, a resistance variable layer 20 provided on the first insulating layer 18 including the lower electrode wires 19, and stripe-shaped upper electrode wires 21 provided on the resistance variable layer 20 so as to respectively cross the lower electrode wires 19. The first insulating layer 18 is an example of the memory region insulating layer covering the rear surface of the stripe-shaped lower electrode wires 19.

Each memory portion 26 is constituted by a lower electrode wire 19a, a resistance variable layer 20a and an upper electrode wire 21a in a region where the lower electrode wire 19 and the upper electrode wire 21 cross each other.

In the nonvolatile semiconductor memory apparatus 10 of this embodiment, as shown in FIG. 1, the single resistance variable layer 20 is formed to extend continuously in a solid state to serve as the resistance variable layers 20a in all regions where the lower electrode wires 19 and the upper electrode wires 21 cross each other as shown in FIG. 1(a). Therefore, in this case, when the nonvolatile semiconductor memory apparatus 10 is viewed from above, a region surrounded by the outer periphery of the resistance variable layer 20 corresponds to the above memory portion forming region 100. Also, when the nonvolatile semiconductor memory apparatus 10 is viewed in cross-section, a region where the first insulating layer 18, the lower electrode wires 19, the resistance variable layer 20, the upper electrode wires 21 and the insulating protective film 22 are arranged corresponds to the above memory portion forming region 100.

The resistance variable layer 20 in a single form need not be formed to have a large area. Although not shown, for example, a plurality of resistance variable layers having a small area may be arranged in matrix to respectively correspond to the above crossing regions. In this case, a region surrounding by the shortest line and in the annular form the outer periphery of the resistance variable layers arranged at the outermost side corresponds to the above memory portion forming region 100.

The resistance variable layer 20 is formed to extend continuously over substantially the entire surface of the memory portion forming region 100 as shown in FIG. 1(a) in this embodiment. As the material for the resistance variable layer 20, an oxide containing iron, for example, triiron tetroxide ($Fe_3O_4$) is desirably used to stabilize the resistance varying characteristics, perform reproducibility in manufacturing, etc.

The oxygen barrier layer 17 is formed to extend continuously below the region where the resistance variable layer 20 is provided. As the material for the oxygen barrier layer 17, silicon nitride (SiN), silicon oxynitride (SiON), alumina ($Al_2O_3$), tantalum oxide (TaO), titanium oxide ($TiO_2$), hafnium oxide ($HfO_2$) or zircon oxide ($ZrO_2$) may be used. For example, when SiN is used, the oxygen barrier layer 17 can be formed by a chemical vapor deposition (CVD) process, a plasma chemical vapor deposition (PCVD) process, etc. Using other materials, the oxygen barrier layer 17 can be formed by the CVD process, the PCVD process, a sputtering process, etc.

In this embodiment, the first insulating layer 18 is desirably formed of a material with a low dielectric constant to reduce a parasitic capacitance formed between the lower electrode wires 19. For example, silicon carbon nitride (SiCN) or silicon oxycarbite (SiOC) may be used for the first insulating layer 18. It should be noted that a silicon oxide commonly used for the interlayer insulating layer may be used for the first insulating layer 18 when an interval between the lower electrode wires 19 is relatively large.

In the nonvolatile semiconductor memory apparatus 10 of this embodiment, the material which is excellent in a low dielectric constant is selected preferentially as the material for the first interlayer insulating layer 18 as described above, and a material which is suitable for a oxygen barrier property cannot be always selected for the first interlayer insulating layer 18. For this reason, there may be a possibility that oxygen permeates the silicon carbon nitride (SiCN) or the silicon oxycarbite (SiOC) which is the first insulating layer 18 based on a specified diffusion coefficient. Accordingly, by forming the oxygen barrier layer 17 using the above various materials which are excellent in oxygen barrier property rather than the silicon carbon nitride or the silicon oxycarbite, oxygen blocking between the memory portion forming region 100 and the wire forming region is properly accomplished.

The lower electrode wires 19 and the upper electrode wires 21 are respectively connected to the semiconductor electrode wires in regions different from the region (memory portion forming region 100) where the resistance variable layer 20 is provided. To be specific, as shown in FIG. 1, the lower electrode wires 19 are respectively connected to the semiconductor electrode wires 16 via the embedded electric conductors 25 and further to the active elements 12 via the embedded electric conductors 23 and 24 and the semiconductor electrode wires 15. The upper electrode wires 21 are respectively connected to another active element (not shown) via the embedded electric conductors 27 in the same manner.

The active elements 12 are each formed by a transistor including a source region 12a, a drain region 12b, a gate insulating film 12c, and a gate electrode 12d. The active element forming region typically includes elements required for a memory circuit such as a DRAM as well as the active elements 12.

The low dielectric constant material is desirably used for the wire insulating layer 22 (insulating protective film 22) covering the upper electrode wires 21, as in the first insulating layer 18. For example, silicon carbon nitride (SiCN) or silicon oxycarbite (SiOC) is desirably used for the wire insulating layer 22 as in the first insulating layer 18. Nonetheless, silicon oxide or silicon nitride commonly used conventionally may be used when an interval between the upper electrode wires is relatively large. The above wire insulating layer 22 is an example of the memory region insulating layer covering the surface (main surface) of the stripe-shaped upper electrode wires 22.

Since the nonvolatile semiconductor memory apparatus 10 of this embodiment is configured as described above, the oxygen barrier layer 17 is capable of disconnecting the wire forming region from the memory portion forming region 100. Further, since the oxygen barrier layer 17 below the region where the resistance variable layer 20 is provided is not provided with an embedded electric conductor, and the like, it is possible to prevent diffusion of oxygen via the embedded electric conductor and the like. As a result, it is possible to avoid an event that oxygen diffuses into the wire forming region and causes a damage to the semiconductor electrode wires 15 and 16 or the semiconductor interlayer insulating layers 13 and 14 in the wire forming region in the step for forming the resistance variable layer 20 and its subsequent steps. Therefore, copper wires or fluorine-based interlayer insulating material which is easily oxidized may be used. Thus, the ReRAM 10 which reduces a parasitic capacitance, and has higher density and a larger capacity is attainable.

Figure 2:
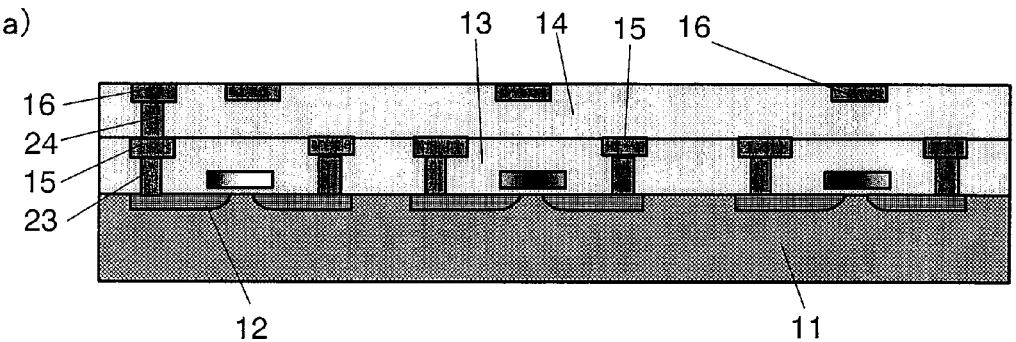
FIG. 2 is a cross-sectional view showing a former part of manufacturing steps of the nonvolatile semiconductor memory apparatus according to Embodiment 1 of the present invention.
Figure 2:
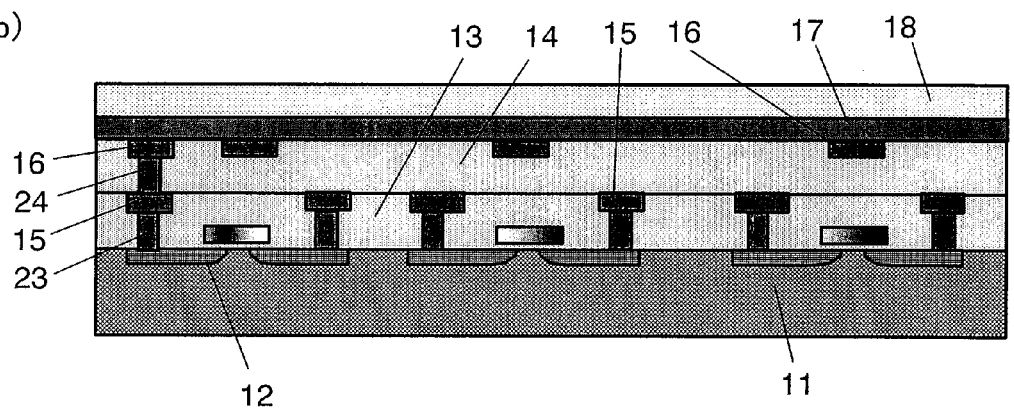
Figure 2:
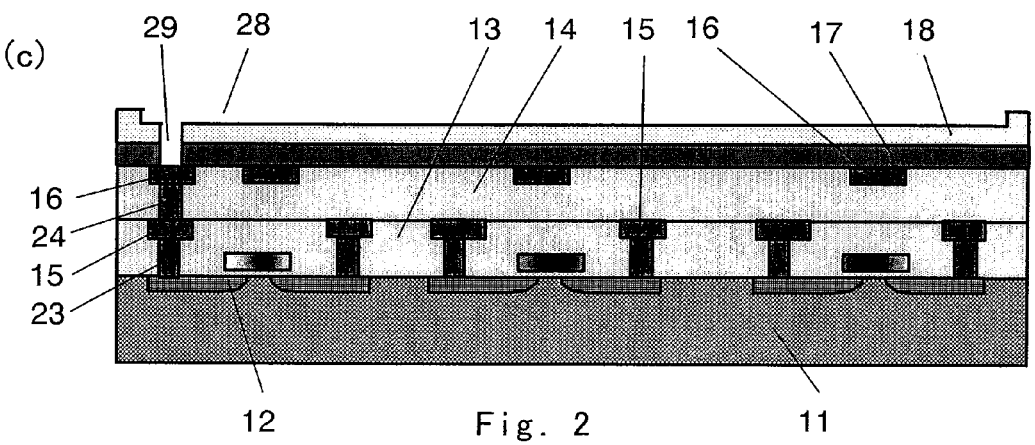
Figure 3:
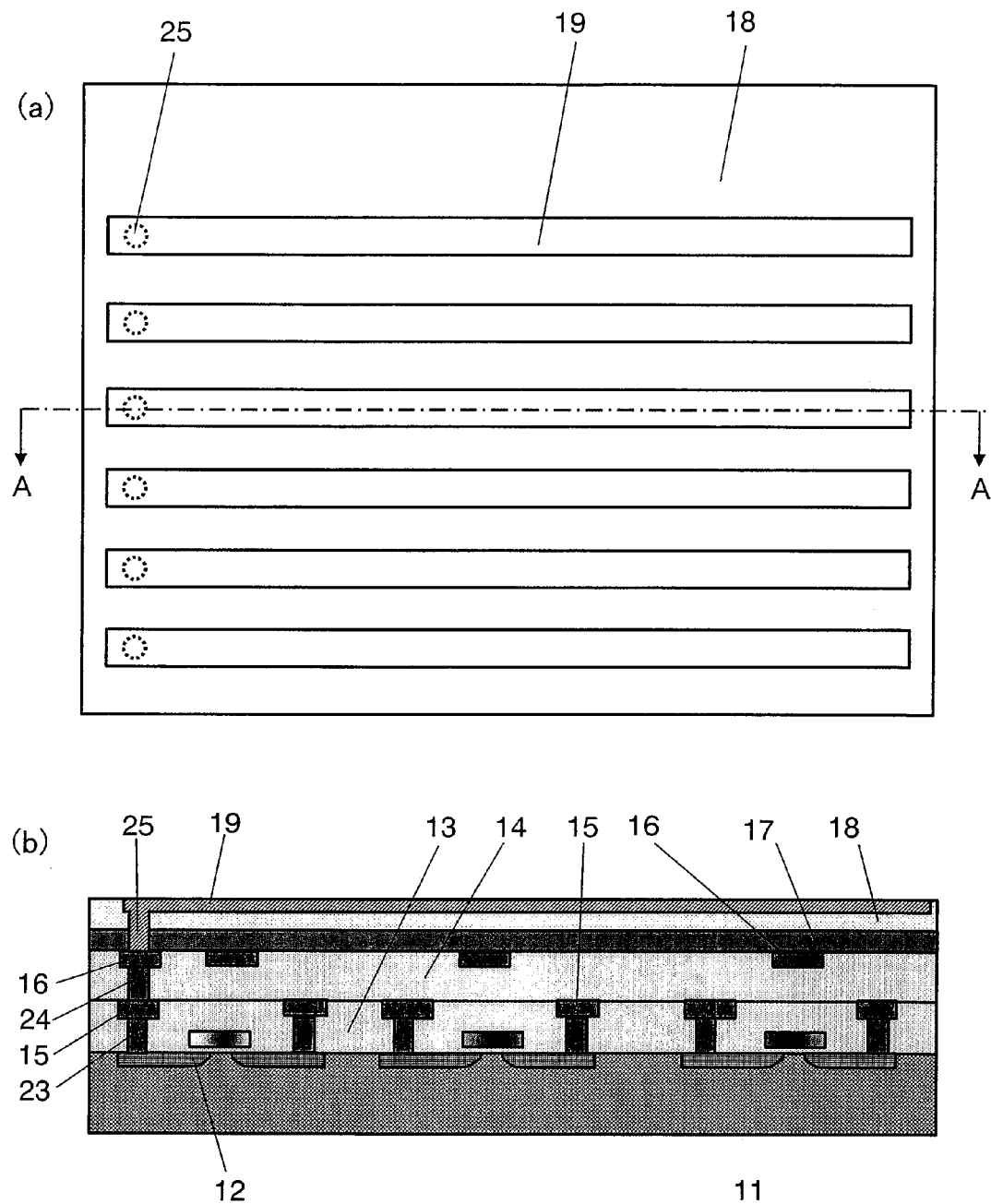
FIG. 3(a) is a plan view showing a step for forming a memory portion forming region in manufacturing steps of the nonvolatile semiconductor memory apparatus according to Embodiment 1 of the present invention.
FIG. 3(b) is a cross-sectional view taken in the direction of arrows along line A-A.
Figure 4:
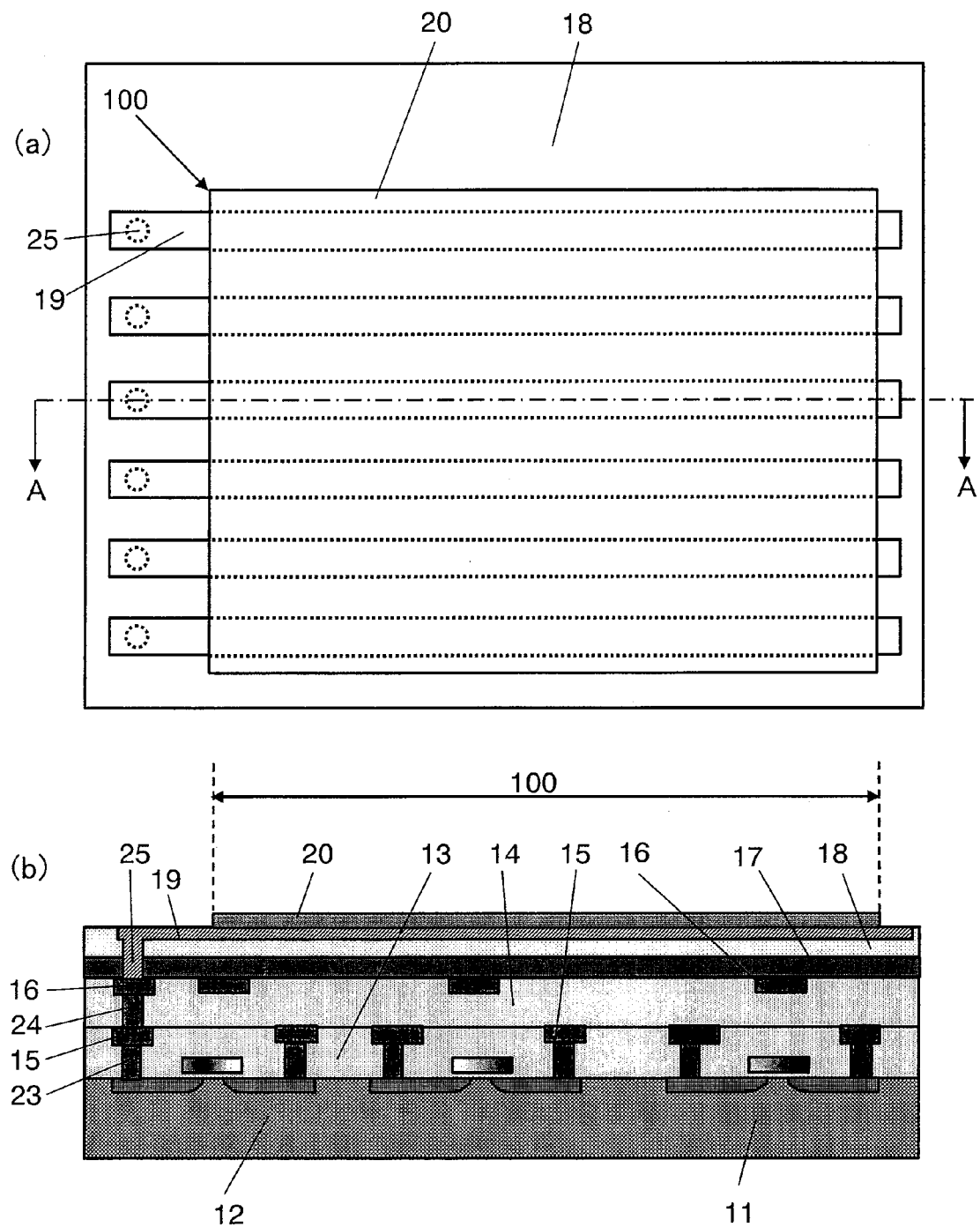
FIG. 4(a) is a plan view showing a step for forming the memory portion forming region in manufacturing steps of the nonvolatile semiconductor memory apparatus according to Embodiment 1 of the present invention.
FIG. 4(b) is a cross-sectional view taken in the direction of arrows along line A-A.
Figure 5:
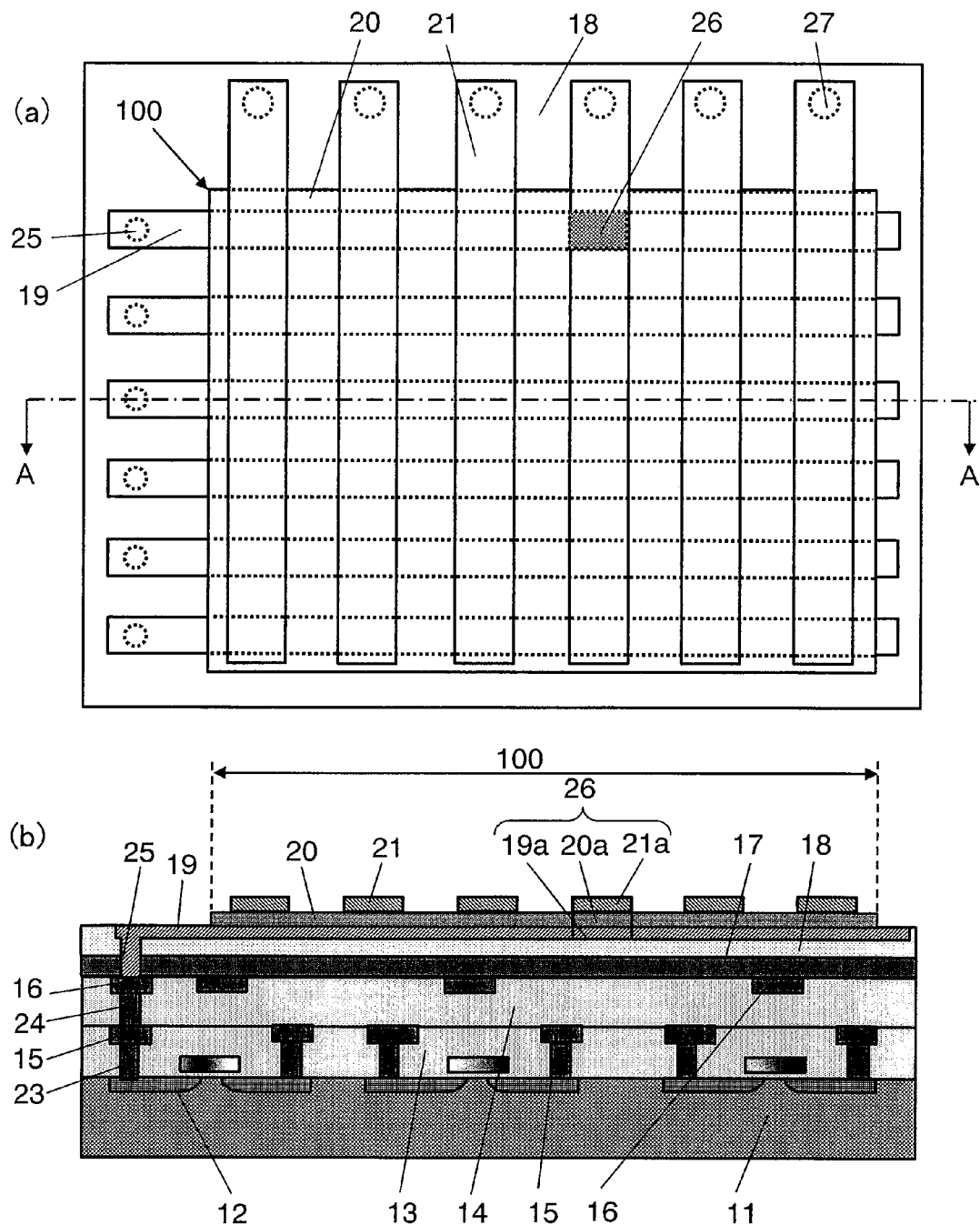
FIG. 5(a) is a plan view showing a step for forming the memory portion forming region in manufacturing steps of the nonvolatile semiconductor memory apparatus according to Embodiment 1 of the present invention.
FIG. 5(b) is a cross-sectional view taken in the direction of arrows along line A-A.

Subsequently, a manufacturing method of the nonvolatile semiconductor memory apparatus 10 of this embodiment will be described with reference to FIGS. 2 to 5. FIG. 2 is a cross-sectional view showing a former half part of manufacturing steps of the nonvolatile semiconductor memory apparatus 10 according to this embodiment. FIGS. 3 to 5 are views showing steps for forming the memory portion forming region. FIGS. 3(a), 4(a), and 5(a) are plan views and FIG. 3(b), 4(b) and 5(b) are cross-sectional views taken in the direction of the arrows along line A-A.

The manufacturing method of the nonvolatile semiconductor memory apparatus 10 of this embodiment includes a step for forming the active element forming region including a plurality of active elements 12 on the semiconductor substrate 11, a step for forming the wire forming region on the active element forming region to electrically connect the active elements 12 so as to include the plural layers of the semiconductor electrode wires 15 and 16 and the semiconductor interlayer insulating layers 13 and 14 (wire region insulating layer) covering and electrically insulating the semiconductor electrode wires 15 and 16, a step for forming the oxygen barrier layer 17 on the wire forming region, and a step for forming the memory portion forming region 100 on the oxygen barrier layer 17 such that the memory portions 26 whose resistance values change according to electric pulses applied are arranged in matrix.

The step for forming the memory portion forming region 100 includes a step for forming the first insulating layer 18 on the oxygen barrier layer 17, a step for forming the stripe-shaped lower electrode wires 19 above the first insulating layer 18, a step for forming the resistance variable layer 20 on the oxygen barrier layer 17 and on the first insulating layer 18 including the lower electrode wires 19, and a step for forming the stripe-shaped upper electrode wires 21 on the resistance variable layer 20 so as to respectively cross the lower electrode wires 19. In the step for forming the resistance variable layer 20, the single resistance variable layer 20 is formed to extend continuously in a solid state to serve as the resistance variable layers 20a in all regions where the lower electrode wires 19 and the upper electrode wires 21 cross each other. Therefore, in this case, the region surrounded by the outer periphery of the resistance variable layer 20 corresponds to the above memory portion forming region 100.

The resistance variable layer 20 in a single form need not be formed to have a large area. Although not shown, for example, a plurality of resistance variable layers having a small area may be arranged in matrix to respectively correspond to the above crossing regions. In this case, the region surrounding by the shortest line and in the annular form the outer periphery of the resistance variable layers arranged at the outermost side corresponds to the above memory portion forming region 100.

Each memory portion 26 is constituted by the lower electrode wire 19a, the resistance variable layer 20a and the upper electrode 21a in the region where the lower electrode wire 19 and the upper electrode wire 21 cross each other. The oxygen barrier layer 17 is formed to extend continuously below the region where the resistance variable layer 20 is provided. That is, in the step for forming the oxygen barrier layer 17, the oxygen barrier layer 17 is formed to extend continuously over at least the entire of the memory portion forming region 100.

Figure 15:
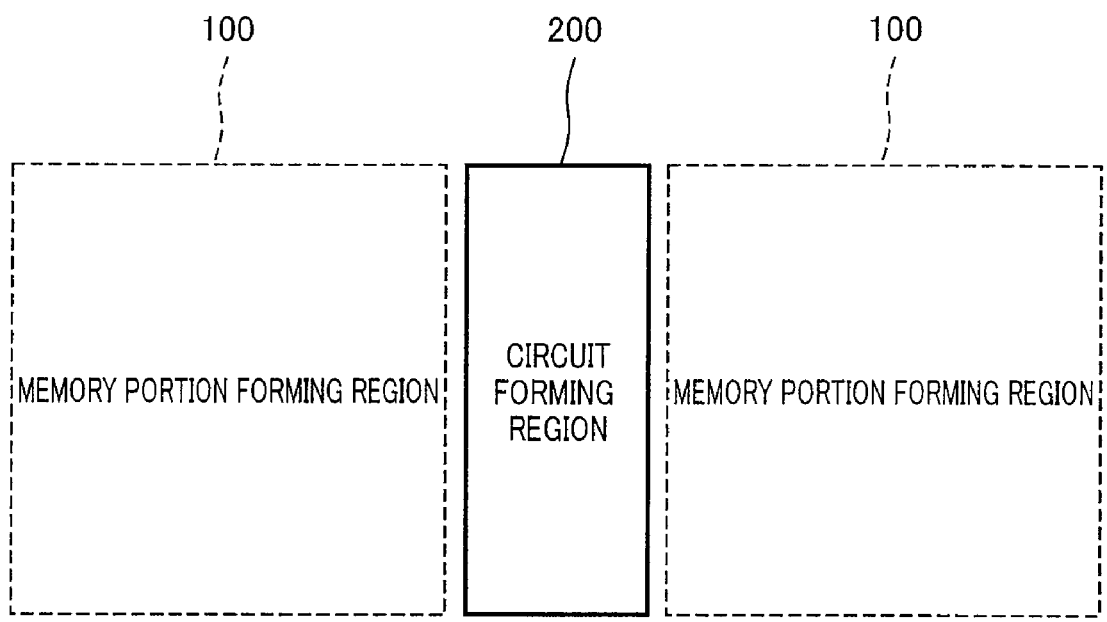
FIG. 15 is a view showing an example of a region which is different from the memory portion forming region.

The lower electrode wires 19 and the upper electrode wires 21 are respectively connected to the semiconductor electrode wires 15 and 16 in regions different from the region where the resistance variable layer 20 is provided. As used herein, the "different region" means planar regions where the resistance variable layer 20 (memory portion forming region 100) is not provided, and an outside region of the planar region where the resistance variable layer 20 is present. In FIG. 1(b), the "different region" is a region located at a left end and a right end where the resistance variable layer 20 is not provided. As shown in FIG. 15, in a case where there are plural memory portion forming regions 100, the "different region" corresponds to a region between the memory portion forming regions 100, for example, a circuit forming region 200 for forming a drive circuit and others. In this structure, even if a part of the resistance variable layer 20 formed of an oxide is decomposed and oxygen diffuses, the wire forming region is not subjected to oxidation because of the absence of the embedded electric conductor 25 below the resistance variable layer 20. That is, the upper and the lower electrode wires are connected to the semiconductor electrode wires without a contact failure.

Hereinafter, the manufacturing method will be described in detail with reference to the drawings.

Initially, as shown in FIG. 2(a), the active element forming region including the plurality of active elements 12 is formed on the semiconductor substrate 11. Then, the wire forming region is formed to connect the active elements 12. The wire forming region is constituted by the semiconductor electrode wires 15 and 16 and the semiconductor interlayer insulating layers 13 and 14. Traditionally, aluminum was commonly used for the semiconductor electrode wires 15 and 16. But, in recent years, copper which can provide low-resistance even in a miniaturized structure is commonly used. For the semiconductor interlayer insulating layers 13 and 14, a fluorine-containing oxide, a carbon-containing nitride, or an organic resin material is used to reduce the parasitic capacitance between the wires. In this embodiment, for the semiconductor electrode wires 15 and 16, for example, copper may be used, while for the semiconductor interlayer insulating layers 13 and 14, for example, a fluorine-containing oxide may be used.

Then, the oxygen barrier layer 17 is formed on the wire forming region. As described above, as the material for the oxygen barrier layer 17, silicon nitride (SiN), silicon oxynitride (SiON), alumina ($Al_2O_3$), tantalum oxide (TaO), titanium oxide ($TiO_2$), hafnium oxide ($HfO_2$) or zircon oxide ($ZrO_2$) may be used. In this embodiment, the oxygen barrier layer 17 is formed using SiN by the chemical vapor deposition (CVD) process, by way of example.

Then, the first insulating layer 18 is formed on the oxygen barrier layer 17. As the first insulating layer, in this embodiment, a configuration in which the silicon carbon nitride (SiCN) is formed will be described, by way of example.

Then, as shown in FIG. 2(c), stripe-shaped grooves 28 for embedding the lower electrode wires 19 and contact holes 19 connected with the semiconductor electrode wires 16 are formed in the first insulating layer 18. They can be formed in such a manner that the first insulating layer 18 is processed by a photolithography process and a dry etching process, as in the conventional method.

Then, as shown in FIG. 3, an electric conductor film which serves as the lower electrode wires 19 is formed on the first insulating layer 18. Then, by conducting the CMP, for example, the lower electrode wires 19 and the embedded electric conductors 25 are formed in the grooves 28 and the contact holes 29, respectively. In addition, the first insulating layer 18, the lower electrode wires 19, and the embedded electric conductors 25 are formed to be coplanar and flat. In this step, the plurality of stripe-shaped lower electrode wires 19 are formed and respectively connected to the semiconductor electrode wires 16 via the embedded electric conductors 25. Therefore, the lower electrode wires 19 are respectively connected to the active elements 12 via the semiconductor electrode wires 15 and 16 and the embedded electric conductors 23 and 24. The lower electrode wires 19 may be made of, for example, copper, aluminum, or titanium-aluminum alloy or may be formed of a laminated structure of these.

Then, as shown in FIG. 4, the resistance variable layer 20 is formed above the oxygen barrier layer 17 and on the first insulating layer 18 including the lower electrode wires 19. Since the upper surfaces of the first insulating layer 18, the lower electrode wires 19, and the embedded electric conductors 25 are flat, patterning of the resistance variable layer 20 is easily performed. If a base layer has stepped regions, process variation in the lithography or etching remnant in the step regions may possibly occur. However, in this embodiment, such problems will not arise. The resistance variable layer may be formed using an iron-based oxide, for example, triiron tetroxide ($Fe_3O_4$), by a sputtering process.

Then, as shown in FIG. 5, the stripe-shaped upper electrode wires 21 are formed on the resistance variable layer 20 so as to respectively cross the lower electrode wires 19. As in the lower electrode wires 19, the upper electrode wires 21 may be made of, for example, copper, aluminum, or titanium-aluminum alloy or may be formed of a laminated structure of these. When the upper electrode wires 21 are formed, the embedded electric conductors 27 are formed at the same time. The upper electrode wires 21 are respectively connected to the semiconductor wires 16 via the embedded electric conductors 27 and electrically connected to the active elements provided at a location which is not shown.

Then, an insulating protective film 22 is formed to cover the upper electrode wires 21, thereby manufacturing the nonvolatile semiconductor memory apparatus 10 shown in FIG. 1.

Since the nonvolatile semiconductor memory apparatus 10 of this embodiment is manufactured in the above described manufacturing method, the semiconductor electrode wires 16 can be connected to the upper and lower electrode wires 19 and 21 in the regions different from the region where the resistance variable layer 20 is formed. Therefore, it is possible to attain a nonvolatile semiconductor memory apparatus which does not cause oxidation in the embedded electric conductor 25 and a contact failure. In addition, since the resistance variable layer 20 can be patterned on the flat surface, the patterning is easily performed. That is, advantages of preventing etching remnant and suppressing process variation are achieved.

Embodiment 2

Figure 6:
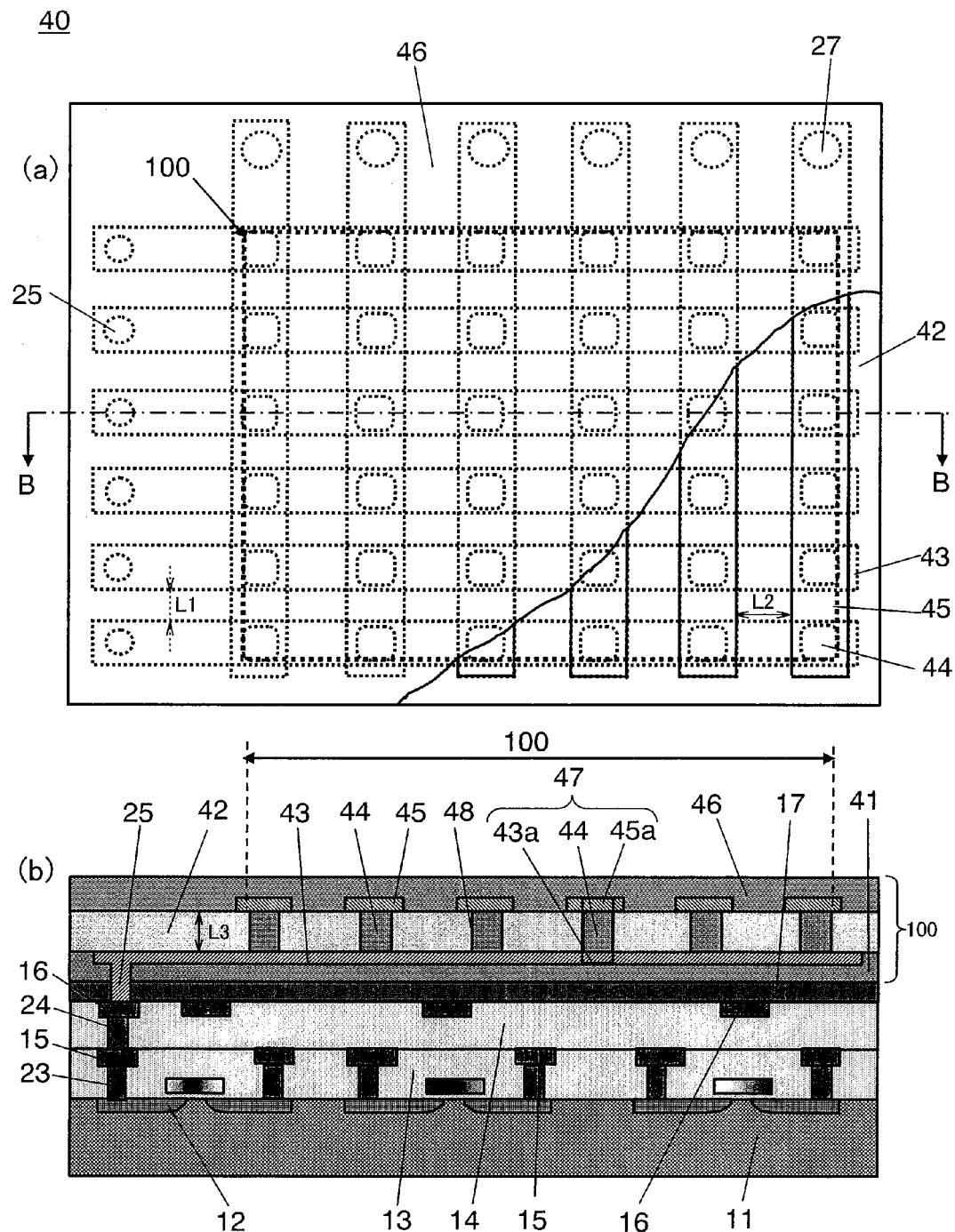
FIG. 6(a) is a plan view showing a configuration of a nonvolatile semiconductor memory apparatus according to Embodiment 2 of the present invention.
FIG. 6(b) is a cross-sectional view taken in the direction of arrows along line B-B.

FIG. 6 is a view showing a configuration of a nonvolatile semiconductor memory apparatus 40 according to Embodiment 2 of the present invention. FIG. 6(a) is a plan view and FIG. 6(b) is a cross-sectional view taken in the direction of arrows along line B-B. In the plan view of FIG. 6(a), a part of the insulating protective film 46 which is the uppermost layer is illustrated as being cut away for easier understanding.

As shown in FIG. 6, the nonvolatile semiconductor memory apparatus 40 of this embodiment comprises the active element forming region including the semiconductor substrate 11 and the plurality of active elements 12 provided on the semiconductor substrate 11, the wire forming region which is provided on the active element forming region to electrically connect the active elements 12 and includes plural layers of semiconductor electrode wires 15 and 16, the memory portion forming region 100 provided on the wire forming region, in which memory portions 47 whose resistance values change according to electric pulses applied are arranged in matrix, and the oxygen barrier layer 17 which is provided between the memory portion forming region 100 and the wire forming region and extends continuously over at least the entire of the memory portion forming region 100 to block oxygen for the entire of memory portion forming region 100.

The active element forming region refers to a region in which three active elements 12 are arranged in FIG. 6, although it is not identified by a reference number. Also, the wire forming region refers to a region comprised of the semiconductor electrode wires 15 and 16 and semiconductor interlayer insulating layers 13 and 14 (wire region insulating layer) for covering and electrically insulating the semiconductor electrode wires 15 and 16, although it is not identified by a reference number. Whereas as shown in FIG. 6, the semiconductor electrode wires 15 and 16 in the wire forming region are formed by two layers and the semiconductor insulating layers 13 and 14 in the wire forming region are formed by two layers, they are not limited to two layers but may be formed by three or more layers. These structures are identical to those of the nonvolatile semiconductor memory apparatus 10 in Embodiment 1. In this embodiment, the dielectric constant of the insulating material used for the semiconductor insulating layers 13 and 14 is smaller than the dielectric constant of the insulating material used for the memory region insulating layer (e.g., first insulating layer 18 or an interlayer insulating layer 42 described later) in the memory portion forming region 100. This makes it possible to reduce a parasitic capacitance between the semiconductor insulating layers 13 and 14 in the wire forming region. Therefore, a circuit operation associated with wire delay can be prevented, and thus the nonvolatile semiconductor memory apparatus 40 can operate at a high speed.

In the nonvolatile semiconductor memory apparatus 40 of this embodiment, the memory portion forming region 100 is configured as follows. To be specific, the memory portion forming region 100 includes stripe-shaped lower electrode wires 43 provided above the wire forming region, with the first insulating layer 41 interposed therebetween, the interlayer insulating layer 42 provided on the first insulating layer 41 including the lower electrode wires 43, contact holes 48 provided in the interlayer insulating layer 42 on the lower electrode wires 43, resistance variable layers 44 which are respectively embedded to fill the contact holes 44 and respectively connected to the lower electrode wires 43, and stripe-shaped upper electrode wires 45 which are provided on the interlayer insulating layer 42 such that the upper electrode wires 45 are respectively connected to the resistance variable layers 44 and respectively cross the lower electrode wires 43. The first insulating layer 41 is an example of the memory region insulating layer covering the rear surface of the stripe-shaped lower electrode wires 43. The interlayer insulating layer 42 is an example of the memory region insulating layer covering the front surface (main surface) of the stripe-shaped lower electrode wires 43.

Figure 11:
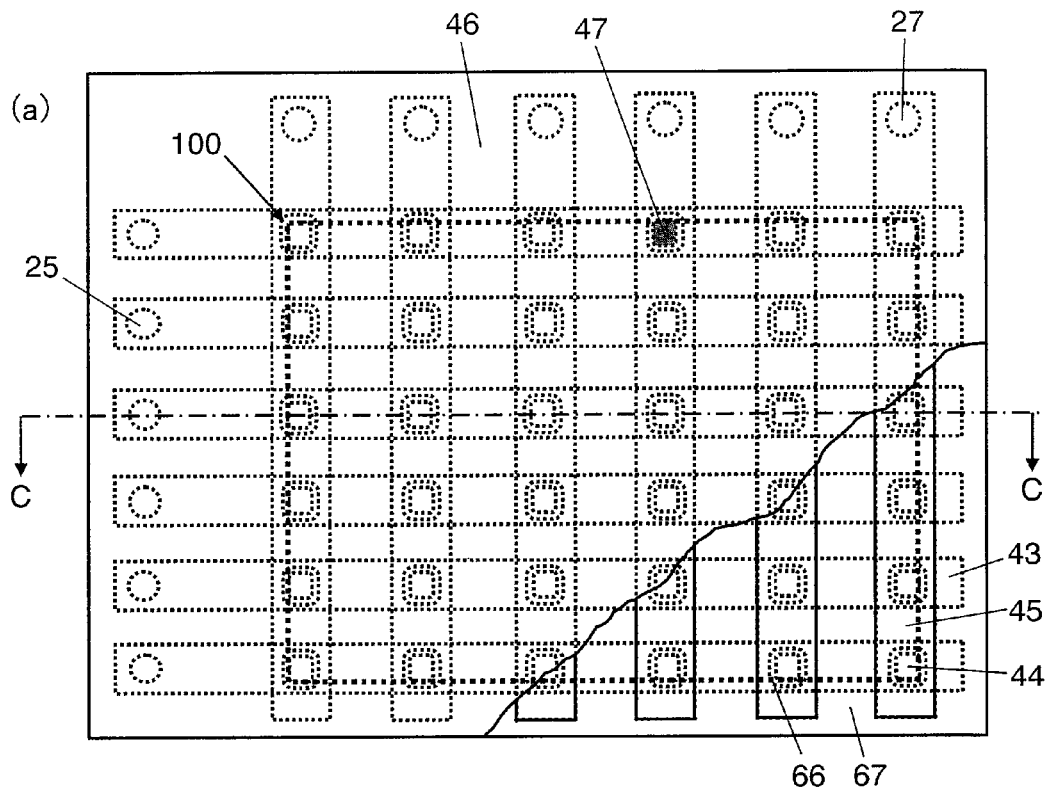
FIG. 11(a) is a plan view showing a configuration of a nonvolatile semiconductor memory apparatus according to Embodiment 3 of the present invention.
FIG. 11(b) is a cross-sectional view taken in the direction of arrows along line C-C.
Figure 11:
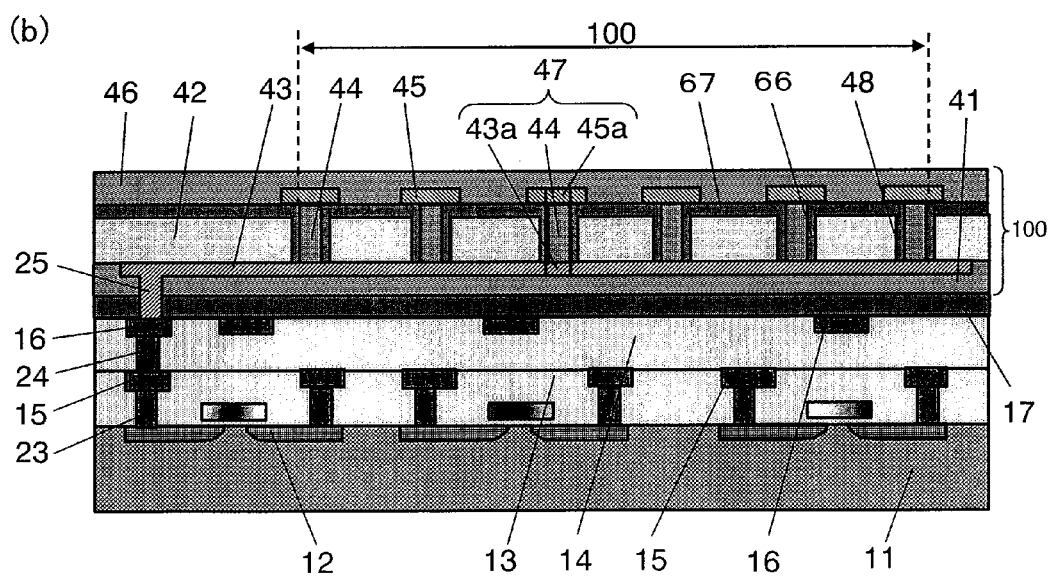

As shown in FIG. 11, in the nonvolatile semiconductor memory apparatus 40 of this embodiment, the resistance variable layers 44 are arranged like islands so as to respectively correspond to the memory portions 47 in a planar view (FIG. 11(a)). Therefore, when the nonvolatile semiconductor memory apparatus 40 is viewed from above, the region surrounding by the shortest line and in the annular form the outer periphery of the resistance variable layers 44 arranged at the outermost side corresponds to the above memory portion forming region 100. When the nonvolatile semiconductor memory apparatus 10 is viewed in the cross-section, as shown in FIG. 1(b), the region where the first insulating layer 41, the lower electrode wires 43, the interlayer insulating layer 42 embedded with the resistance variable layers 44, the upper electrode wires 45 and the insulating protective layer 46 are arranged corresponds to the above memory portion forming region 100.

Each memory portion 47 is constituted by the lower electrode wire 43a, the resistance variable layer 44 and the upper electrode wire 45a in the region where the lower electrode wire 43 and the upper electrode wire 45 cross each other. The oxygen barrier layer 17 extends continuously below the memory portion forming region 100 in which the memory portions 47 are arranged.

Hereinafter, a detailed structure will be described. Since the structure of the active element forming region and the structure of the wire forming region are identical to those of the nonvolatile semiconductor memory apparatus 10 of Embodiment 1 as described above, they will not be further described. The nonvolatile semiconductor memory apparatus 40 of this embodiment is different from the nonvolatile semiconductor memory apparatus 10 of Embodiment 1 in the structure of the memory portion forming region 100. To be specific, the interlayer insulating layer 42 is provided to cover the first insulating layer 41 and the stripe-shaped lower electrode wires 43 provided on the first insulating layer 41. Contact holes 48 are provided at constant arrangement pitches in the interlayer insulating layer 42 on the lower electrode wires 43 and the resistance variable layers 44 are embedded to fill the contact holes 48, respectively.

Furthermore, the upper electrode wires 45 are provided on the interlayer insulating layer 42 such that the upper electrode wires 45 are respectively connected to the resistance variable layers 44 and respectively cross the lower electrode wires 43. The plurality of memory portions 47 are arranged at constant arrangement pitches, thereby forming the memory portion forming region 100. As shown in FIG. 6, the oxygen barrier layer 17 extends continuously below the memory portion forming region 100 in which these memory portions 47 are arranged. That is, the embedded electric conductors and others having a shape penetrating through the oxygen barrier layer 17 are not provided in the region below the memory portion forming region 100.

The lower electrode wires 43 and the upper electrode wires 45 are respectively connected to the semiconductor electrode wires 15 and 16 in the regions different from the memory portion forming region 100 where the memory portions 47 are arranged. As used herein, the "different region" means planar regions where the resistance variable layers 44 are not provided, and an outside region of the planar region where the resistance variable layers 44 are present. In FIG. 6(b), for example, the "different region" is a region located at a left end and a right end. As shown in FIG. 15, in a case where there are plural memory portion forming regions 100, the "different region" is a region between the memory portion forming regions 100, for example, a circuit forming region 200 for forming a drive circuit and others.

In this structure, even if a part of the resistance variable layers 44 made of an oxide is decomposed and oxygen diffuses, the wire forming region is not subjected to oxidation because of the absence of the embedded electric conductor 25 below the resistance variable layers 44. That is, the upper and the lower electrode wires can be connected to the semiconductor electrode wires without a contact failure.

For example, the lower electrode wires 43 are connected to the semiconductor electrode wires 16 via the embedded electric conductors 25 and further to the active elements 12 via the embedded electric conductors 23 and 24 and the semiconductor electrode wires 15. In the same manner, the upper electrode wires 45 are connected to the semiconductor electrode wires (not shown) via the embedded electric conductors 27 and to the active elements (not shown) via the embedded electric conductors (not shown). The detail of how these are connected is the same as the connecting method described above, and will not be described.

In the nonvolatile semiconductor memory apparatus 40 of this embodiment, at least one of the wire insulating layers 41 and 46 which are provided between adjacent lower electrode wires 43 and between adjacent upper electrode wires 45 are made of a material having a dielectric constant smaller than that of the interlayer insulating layer 42. The lower electrode wires 43 are embedded in the first insulating layer 41 such that main surfaces thereof are exposed. The insulating layer 41 also serves as the wire insulating layer. For example, in the case where a silicon oxide layer formed using a tetraethyloxysilane-ozone (TEOS-$O_3$) based gas or fluorosilicate glass (FSG) is used as the interlayer insulating layer 42, the wire insulating layers 41 and 46 may be silicon carbon nitride layer (SiCN) or silicon oxycarbite layer (SiOC). The wire insulating layer 41 (first insulating layer) is an example of the memory region insulating layer covering the rear surfaces of the lower electrode wires 43. The wire insulating layer 46 (protective insulating film 46) is an example of the memory region insulating layer covering the front surface (main surface) of the upper electrode wires 45.

In the nonvolatile semiconductor memory apparatus 40 of this embodiment, as shown in FIG. 6, an interval L1 between adjacent lower electrode wires 43, and/or an interval L2 between adjacent upper electrode wires 45 is/are smaller than a thickness L3 of the interlayer insulating layer. In this manner, the density of integration of the nonvolatile semiconductor memory apparatus 40 is improved.

Since the nonvolatile semiconductor memory apparatus 40 of this embodiment is configured as described above, the oxygen barrier layer 17 is capable of disconnecting the wire forming region from the memory portion forming region 100. Further, since the oxygen barrier layer 17 below the memory portion forming region 100 is not provided with embedded electric conductors and the like, it is possible to prevent diffusion of oxygen via the embedded electric conductors and the like. As a result, it is possible to avoid an event that oxygen diffuses into the wire forming region and causes a damage to the semiconductor electrode wires 15 and 16 or the semiconductor interlayer insulating layers 13 and 14 in the wire forming region in the step for forming the resistance variable layer 44 and its subsequent steps. Therefore, copper wires or fluorine-based interlayer insulating material which is easily oxidized may be used. Thus, the nonvolatile semiconductor memory apparatus 40 which reduces a parasitic capacitance, and has a high density and a larger capacity is attainable.

Furthermore, since the wire insulating layers 41 and 46 provided between the lower electrode wires 43 and between the upper electrode wires 45 are made of the material whose dielectric constant is smaller than that of the interlayer insulating layer 42, the parasitic capacitance between the wires can be further reduced and a high-speed operation is attained.

Figure 7:
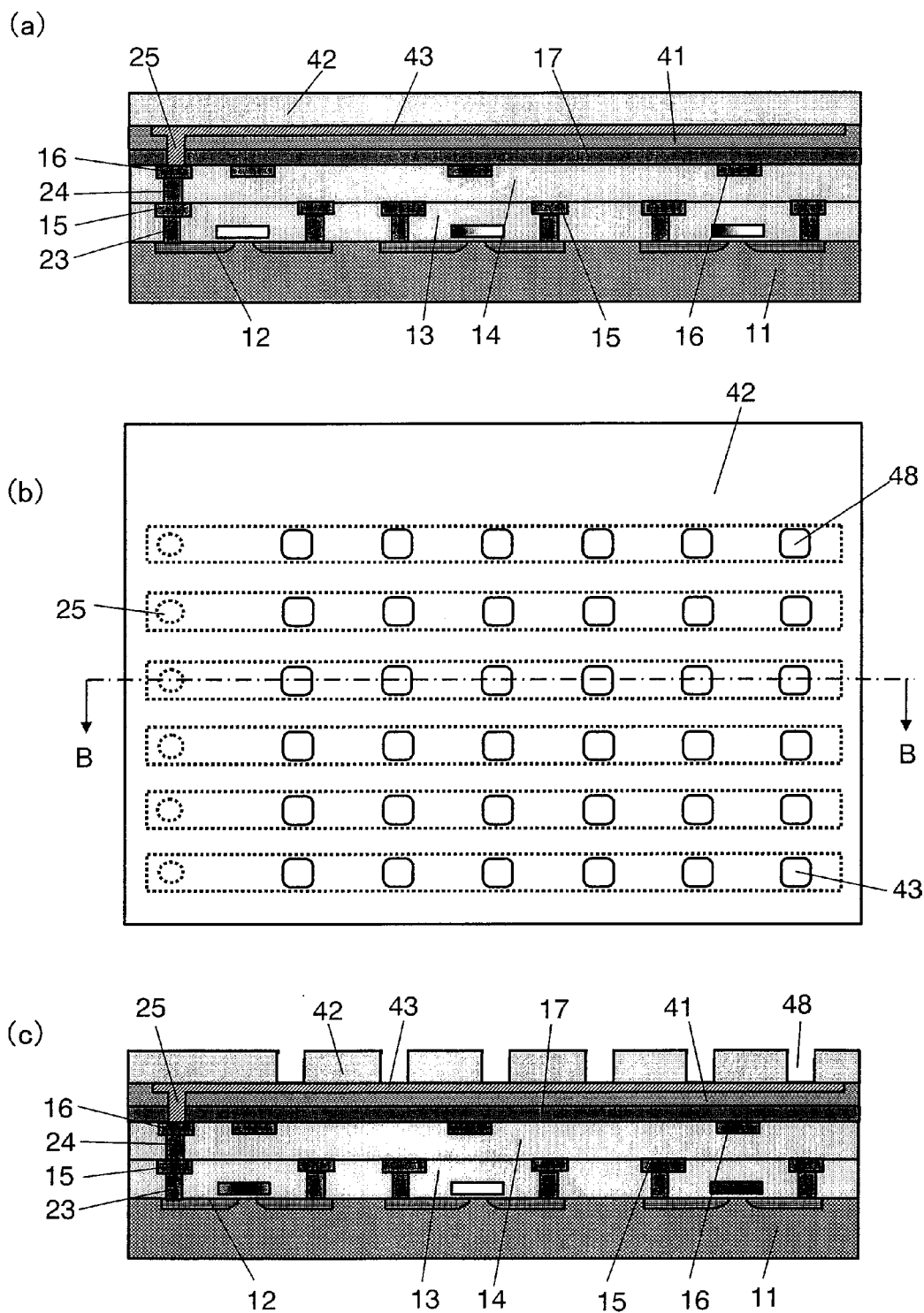
FIG. 7(a) is a view showing manufacturing steps of the nonvolatile semiconductor memory apparatus according to Embodiment 2 of the present invention, and is a cross-sectional view showing a state where an interlayer insulating layer is formed.
FIG. 7(b) is a plan view showing a state where contact holes are open.
FIG. 7(c) is a cross-sectional view taken in the direction of arrows along line B-B of FIG. 7(b).
Figure 8:
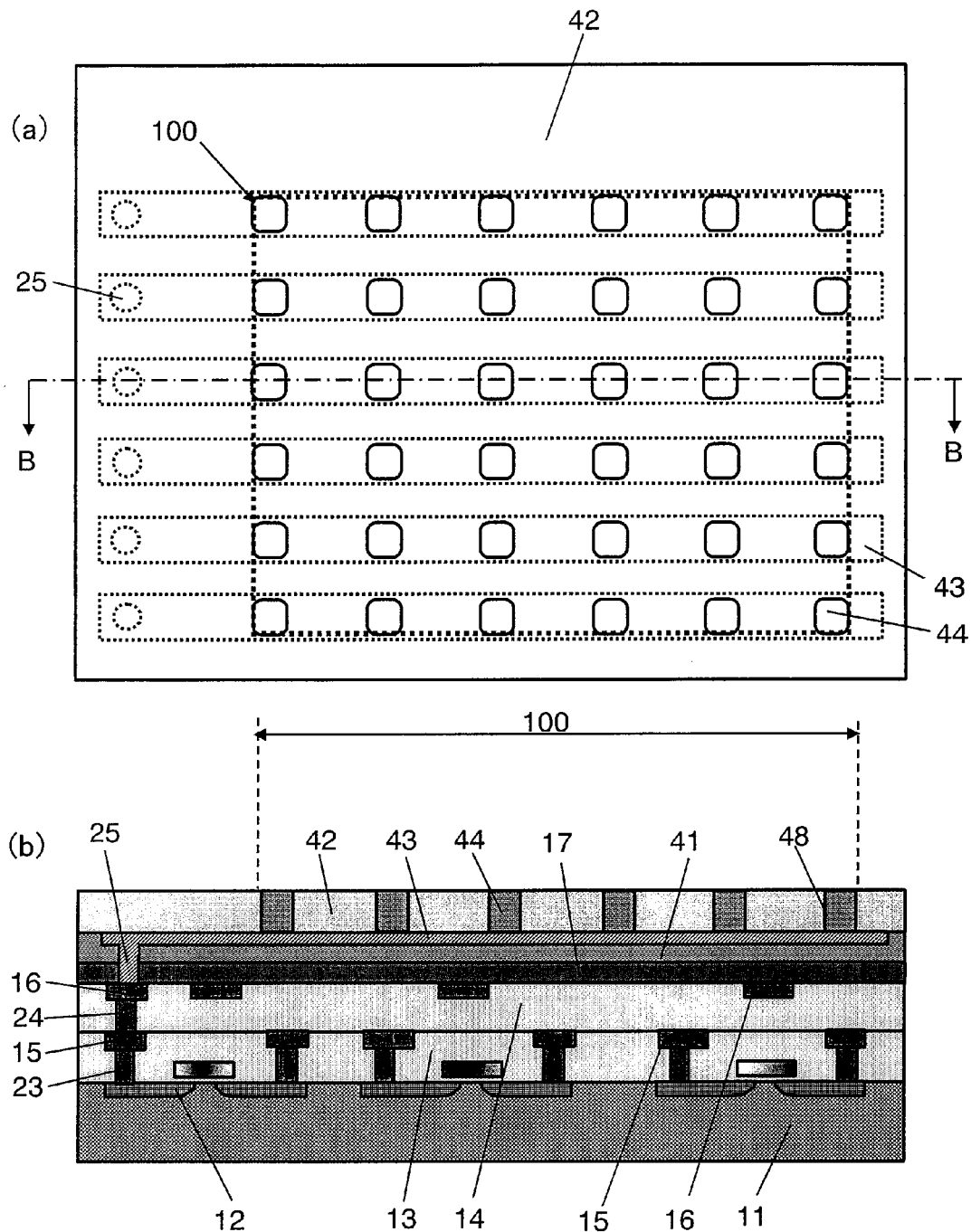
FIG. 8(a) is a view showing manufacturing steps of the nonvolatile semiconductor memory apparatus according to Embodiment 2 of the present invention, and is a plan view showing the step for embedding resistance variable layers to fill the contact holes.
FIG. 8(b) is a cross-sectional view taken in the direction of arrows along line B-B of FIG. 8(a).
Figure 9:
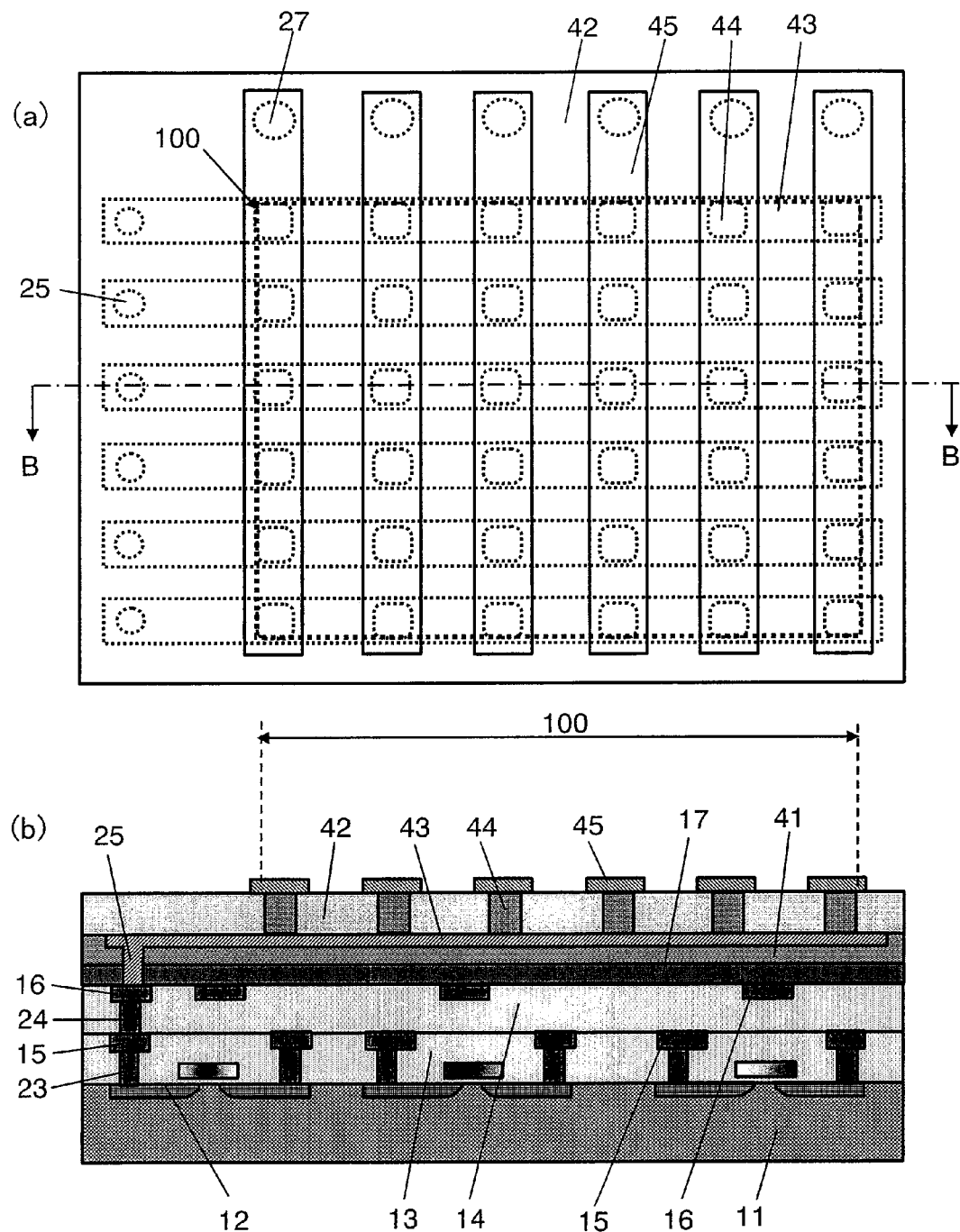
FIG. 9(a) is a view showing manufacturing steps of the nonvolatile semiconductor memory apparatus according to Embodiment 2 of the present invention, and is a plan view showing a step for forming upper electrode wires.
FIG. 9(b) is a cross-sectional view taken in the direction of arrows along line B-B of FIG. 9(a).

Subsequently, a manufacturing method of the nonvolatile semiconductor memory apparatus 40 of this embodiment will be described with reference to FIGS. 7 to 9. FIG. 7 is a view showing manufacturing steps of the nonvolatile semiconductor memory apparatus 40 according to this embodiment. FIG. 7(a) is a cross-sectional view showing a state where the interlayer insulating layer 42 is formed. FIG. 7(b) is a plan view showing a state where the contact holes 48 are formed. FIG. 7(c) is a cross-sectional view taken in the direction of arrows along line B-B of FIG. 7(b). FIG. 8 is a view showing manufacturing steps of the ReRAM 40 of this embodiment. FIG. 8(a) is a view showing a step for embedding the resistance variable layers 44 to fill the contact holes 48. FIG. 8(b) is a cross-sectional view taken in the direction of arrows along line B-B of FIG. 8(a). FIG. 9 is a view showing manufacturing steps of the ReRAM 40 of this embodiment. FIG. 9(a) is a plan view showing a step for forming the upper electrode wires 45. FIG. 9(b) is a cross-sectional view taken in the direction of arrows along line B-B of FIG. 9(a).

Initially, as shown in FIG. 7(a), the lower electrode wires 43 are embedded on the first insulating layer 41, and the interlayer insulating layer 42 is formed on the surfaces thereof. The step for forming the first insulating layer 41 and embedding the lower electrode wires 43 and the preceding steps are identical to the steps described in the method of manufacturing the nonvolatile semiconductor memory apparatus 10 of Embodiment 1 and will not be further described. That is, by forming the interlayer insulating layer 42 over the entire surface after the structure shown in FIG. 3 is formed, the structure shown in FIG. 7(a) is obtained.

Then, as shown in FIGS. 7(b) and 7(c), the contact holes 48 are formed above the oxygen barrier layer 17 and in the interlayer insulating layer 42 on the lower electrode wires 43 such that the lower electrode wires 43 are exposed. This is easily conducted by using a common semiconductor forming process including an exposure process and an etching process. The shape of the contact holes 48 may be a circle, an oval, a rectangle, etc, instead of a quadrangle shown. It is desired that the shape of the contact holes 48 be smaller in size than the width of the lower electrode wires 43, in order to carry out the etching process stably.

Then, as shown in FIG. 8, the resistance variable layers 44 are formed in such a manner that the resistance variable layers 44 are respectively embedded to fill the contact holes 48 and respectively connected to the lower electrode wires 43. This is formed as follows. That is, the thin film which serves as the resistance variable layers 44 is formed to a thickness which allows the contact holes 48 to be fully filled with the thin film. Then, by conducting the CMP, the resistance variable layers 44 can be embedded to fill the contact holes 48. This makes it possible to form the resistance variable layers 44 in self-alignment manner in the cells which require the resistance variable layers 44 and to thus minimize the region where the resistance variable layers are formed. In the step of embedding the resistance variable layers 44, the resistance variable layers 44 are formed like islands so as to respectively correspond to the regions where the lower electrode wires 44 and the upper electrode wires 45 to be formed in the later step cross each other. Therefore, the region surrounding by the shortest line and in the annular form the outer periphery of the resistance variable layers 44 arranged at the outermost side corresponds to the above memory portion forming region 100.

Then, as shown in FIG. 9, the stripe-shaped upper electrode wires 45 are formed on the interlayer insulating layer 42 such that the upper electrode wires 45 are respectively connected to the resistance variable layers 44 and respectively cross the lower electrode wires 43. In this step, as shown in FIG. 6, each memory portion 47 is constituted by the lower electrode wire 43a, the resistance variable layer 43, and the upper electrode wire 45a in the region where the lower electrode wire 44 and the upper electrode wires 45 cross each other. The oxygen barrier layer 17 extends continuously below the memory portion forming region 100 in which the memory portions 47 are arranged. That is, in the step for forming the oxygen barrier layer 17, the oxygen barrier layer 17 is formed to extend continuously over at least the entire of the memory portion forming region 100.

Then, by forming the wire insulating layer 46 on the interlayer insulating layer including the upper electrode wires 45, the nonvolatile semiconductor memory apparatus 40 of this embodiment is attained. For example, in the case where a silicon oxide layer formed using a tetraethyloxysilane-ozone (TEOS-$O_3$) based gas or a fluorosilicate glass (FSG) is used for the interlayer insulating layer 43, the wire insulating layers 41 and 46 may be desirably silicon carbon nitride layer (SiCN) or silicon oxycarbite layer (SiOC). In this manner, even when the memory portions are formed with high density by reducing a wire interval of at least one of between the lower electrode wires 43 and between the upper electrode wires 45, the nonvolatile semiconductor memory apparatus 40 which has a smaller parasitic capacitance between the wires, is capable of a high-speed operation, and has a large capacity is attainable.

As the materials for the oxygen barrier layer 17, the lower electrode wires 43, the resistance variable layers 44, the upper electrode wires 45, the active element forming region, the wire forming region, etc., the materials described in Embodiment 1 may be used, and therefore description thereof will not be given repetitively.

Since the nonvolatile semiconductor memory apparatus 40 of this embodiment is manufactured with the above described method, the semiconductor electrode wires are connected to the upper and lower electrode wires in the regions different from the region where the resistance variable layers are formed. Therefore, it is possible to attain a nonvolatile semiconductor memory apparatus in which the embedded electric conductors 25 are not subjected to oxidation and a contact failure does not occur. Further, since the resistance variable layers can be formed only in desired regions in self-alignment manner, the embedded electric conductors 25 are arranged more flexibly. That is, it is possible to achieve an advantage that the area of the memory cell array can be reduced by devising the arrangement of the embedded electric conductors (e.g., by arranging the embedded electric conductors between the resistance variables layers).

Figure 10:
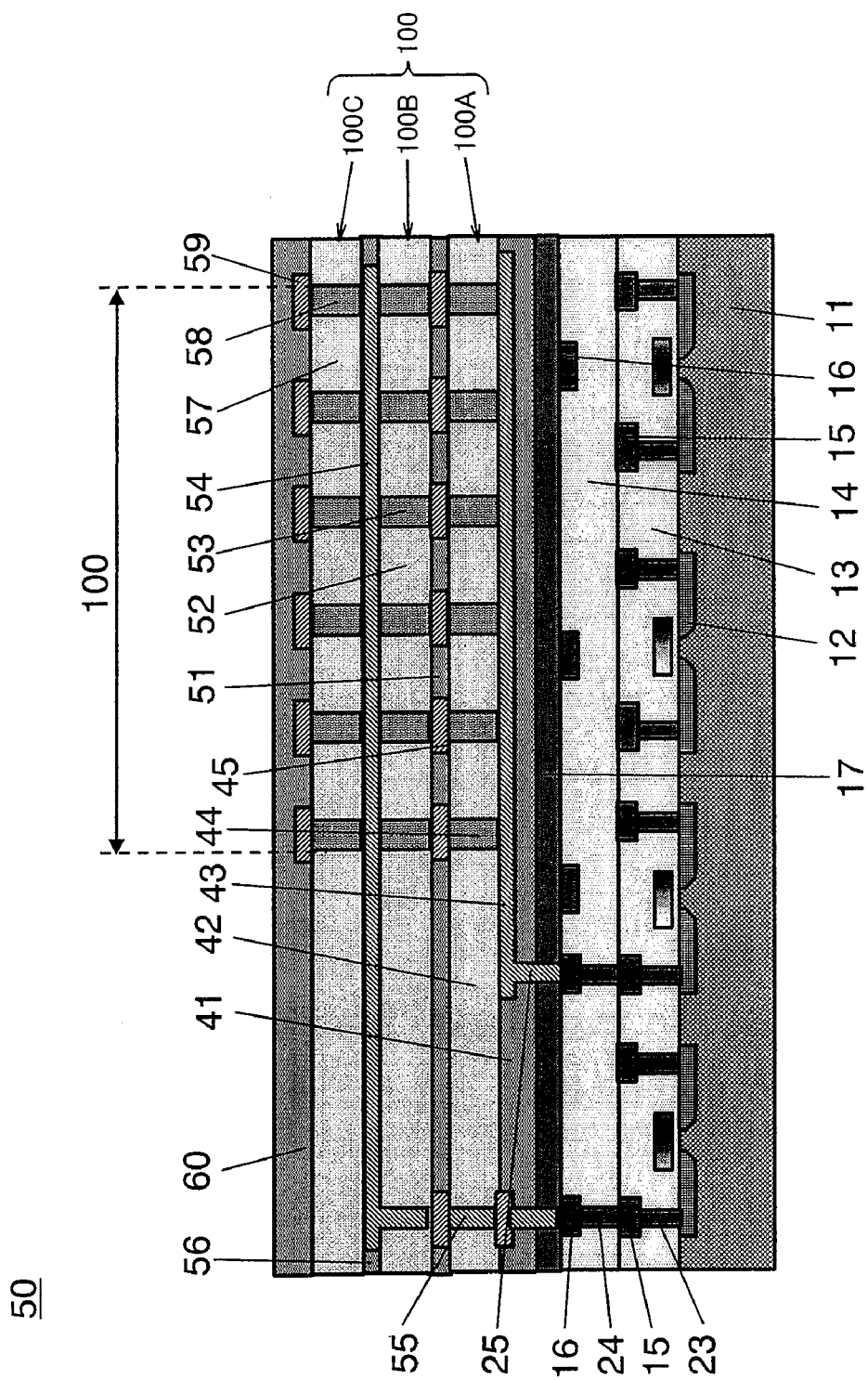
FIG. 10 is a cross-sectional view showing a configuration of a nonvolatile semiconductor memory apparatus according to Modification of Embodiment 2 of the present invention.

FIG. 10 is a cross-sectional view showing a configuration of a nonvolatile semiconductor memory apparatus 50 according to Modification of this embodiment. The nonvolatile semiconductor memory apparatus 50 of this modification has a feature in which a plurality of memory portion forming regions 100 are stacked to form a layer structure above the wire forming region. That is, the basic configuration of the nonvolatile semiconductor memory apparatus 50 is identical to that of the nonvolatile semiconductor memory apparatus 40 of this embodiment, but the memory apparatus 50 has a feature in which the memory portion forming regions 100 are stacked to form a layer structure. The nonvolatile semiconductor memory apparatus 50 of this modification has a configuration which is basically identical to that of the nonvolatile semiconductor memory apparatus 40 of this embodiment in the constituents formed before and in the step for forming the memory portions 47 in the regions where the lower electrode wires 43 and the upper electrode wires 45 cross each other to provide the memory portion forming region 100. For the convenience of the explanation, hereinafter, the memory portions each constituted by the lower electrode wire 43, the resistance variable layer 44 and the upper electrode wire 45 are referred to as first memory portions. And, the region where the first memory portions are arranged is referred to as a first memory portion forming region 100A.

Second memory portions are each constituted by the upper electrode wire 45 of the first memory portion as its lower electrode wire, and a resistance variable layer 53 connected to the upper electrode wire 45 and an upper electrode wire 54. The region where the second memory portions are arranged is referred to as a second memory portion forming region 100B. As shown in FIG. 10, the upper electrode wire 54 is connected to the semiconductor wire 16 via the embedded electric conductor 55 penetrating through the plural layers and further to the active element 12 via the embedded electric conductors 23 and 24 and another semiconductor electrode wire 15. As shown in FIG. 10, the lower electrode wire 43 forming the first memory portion is connected to the active element 12, but the upper electrode wire 54 and the lower electrode wire 43 are connected to different active elements 12, respectively.

Third memory portions are each formed by the upper electrode wire 54 of the second memory portion as its lower electrode wire, and a resistance variable layer 58 connected to the upper electrode wire 54 and an upper electrode wire 59. The region where the third memory portions are arranged is referred to as a third memory portion forming region 100C. The upper electrode wire 59 is connected to the semiconductor electrode wire via the embedded electric conductor in a location not shown and further to the active element not shown via the embedded electric conductor.

As described above, the nonvolatile semiconductor memory apparatus 50 of this modification is formed by three layers of the memory portion forming regions 100A, 100B, and 100C. Between the lower electrode wires 43, between the upper electrode wires 45, between the upper electrode wires 54, and between the upper electrode wires 59, wire insulating layers 41, 51, 56, and 60 are respectively provided. The resistance variable layers 44, 53, and 58 are embedded to fill the contact holes formed in the interlayer insulating layers 41, 52, and 57, respectively. In the nonvolatile semiconductor memory apparatus 50 of this modification, also, the wire insulating layers 41, 51, 56 and 60 are made of a material whose dielectric constant is smaller than the dielectric constant of the interlayer insulating layers 42, 57, and 57. For example, in the case where a silicon oxide layer formed using a tetraethyloxysilane-ozone (TEOS-$O_3$) based gas or fluorosilicate glass (FSG) is used for the interlayer insulating layers 42, 52, and 57, the wire insulating layers 41, 51, 56 and 60 may be silicon carbon nitride layer (SiCN) or silicon oxycarbite layer (SiOC).

In such a configuration, it is possible to suppress diffusion of oxygen generated in the step for forming the memory portion forming region 100 and its subsequent steps and thereby prevent damage to the wire forming region. In addition, since the memory portion forming regions 100 are stacked to form a layer structure, the nonvolatile semiconductor memory apparatus 50 which has a larger memory capacity and is capable of high-speed operation is attainable.

Embodiment 3

FIG. 11 is a view showing a configuration of a nonvolatile semiconductor memory apparatus 65 according to Embodiment 3 of the present invention. FIG. 11(a) is a plan view. FIG. 11(b) is a cross-sectional view taken in the direction of arrows along line C-C. In the plan view of FIG. 11(a), a part of an insulating protective film 46 which is an uppermost layer is illustrated as being cut away for easier understanding.

As shown in FIG. 11, the configuration of the nonvolatile semiconductor memory apparatus 65 of this embodiment is basically identical to that of the nonvolatile semiconductor memory apparatus 40 of Embodiment 2 except the following. That is, first, an oxygen barrier separating film 66 is further provided on a side wall of each of the contact holes 48 and the resistance variable layer 44 is embedded to fill the contact hole 48 with the oxygen barrier separating film 66 interposed between them. In other words, as shown in FIG. 11, the oxygen barrier separating film 66 is provided inside the contact hole 48 such that the oxygen barrier separating film 66 is interposed between the resistance variable layer 44 and the interlayer insulating layer 42.

Second, a second oxygen barrier layer 67 is further provided between the interlayer insulating layer 42 and the upper electrode wire 45. Third, the second oxygen barrier layer 67 is made of the material for the oxygen barrier separating film 66.

As the material for the oxygen barrier separating film 66 and the second oxygen barrier layer 67, silicon nitride (SiN), silicon oxynitride (SiON), alumina ($Al_2O_3$), tantalum oxide (TaO), titanium oxide ($TiO_2$), hafnium oxide ($HfO_2$) or zircon oxide ($ZrO_2$) may be used, as in the oxygen barrier layer 17. In this case, the material for the oxygen barrier layer 17 may be used, or another materials selected from the above materials may be separately used for the oxygen barrier separating film 66 and the second oxygen barrier layer 67.

In such a configuration, the material with a low dielectric contact may be used for the interlayer insulating layer 42. For example, even in the case where fluorine-containing oxide is used for the interlayer insulating layer 42, diffusion of oxygen into the interlayer insulating layer 42 can be prevented in the step for forming the resistance variable layer 44 and its subsequent steps. In particular, it is possible to prevent diffusion of oxygen generated by reduction of the resistance variable layer 44 into the interlayer insulating layer 42. As a result, it is possible to prevent fluctuation in characteristics such as a dielectric constant which would be caused by oxidation of the interlayer insulating layer 42.

Figure 12:
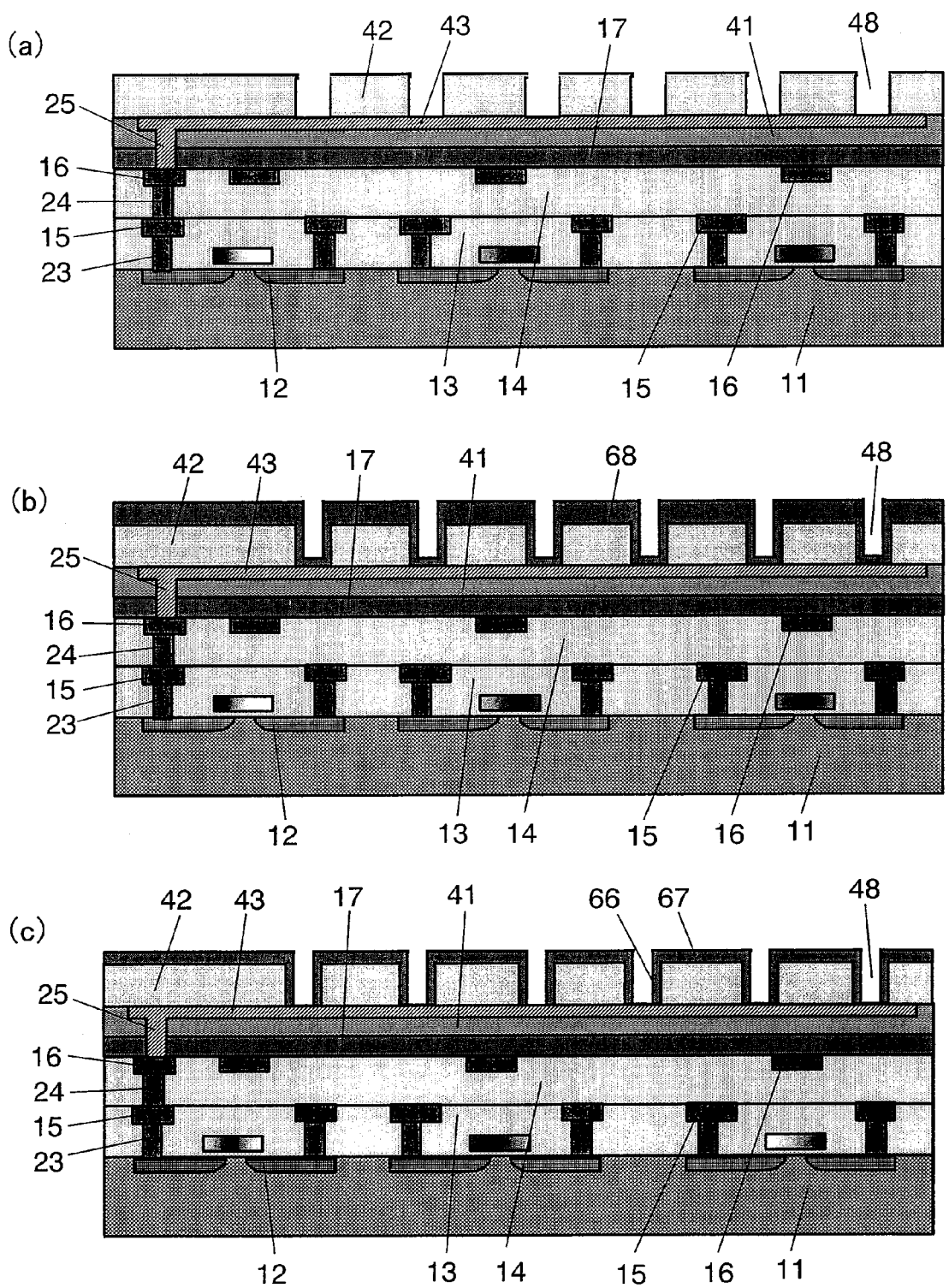
FIG. 12 is a cross-sectional view of major steps for explaining a manufacturing method of the nonvolatile semiconductor memory apparatus according to Embodiment 3 of the present invention.
Figure 13:
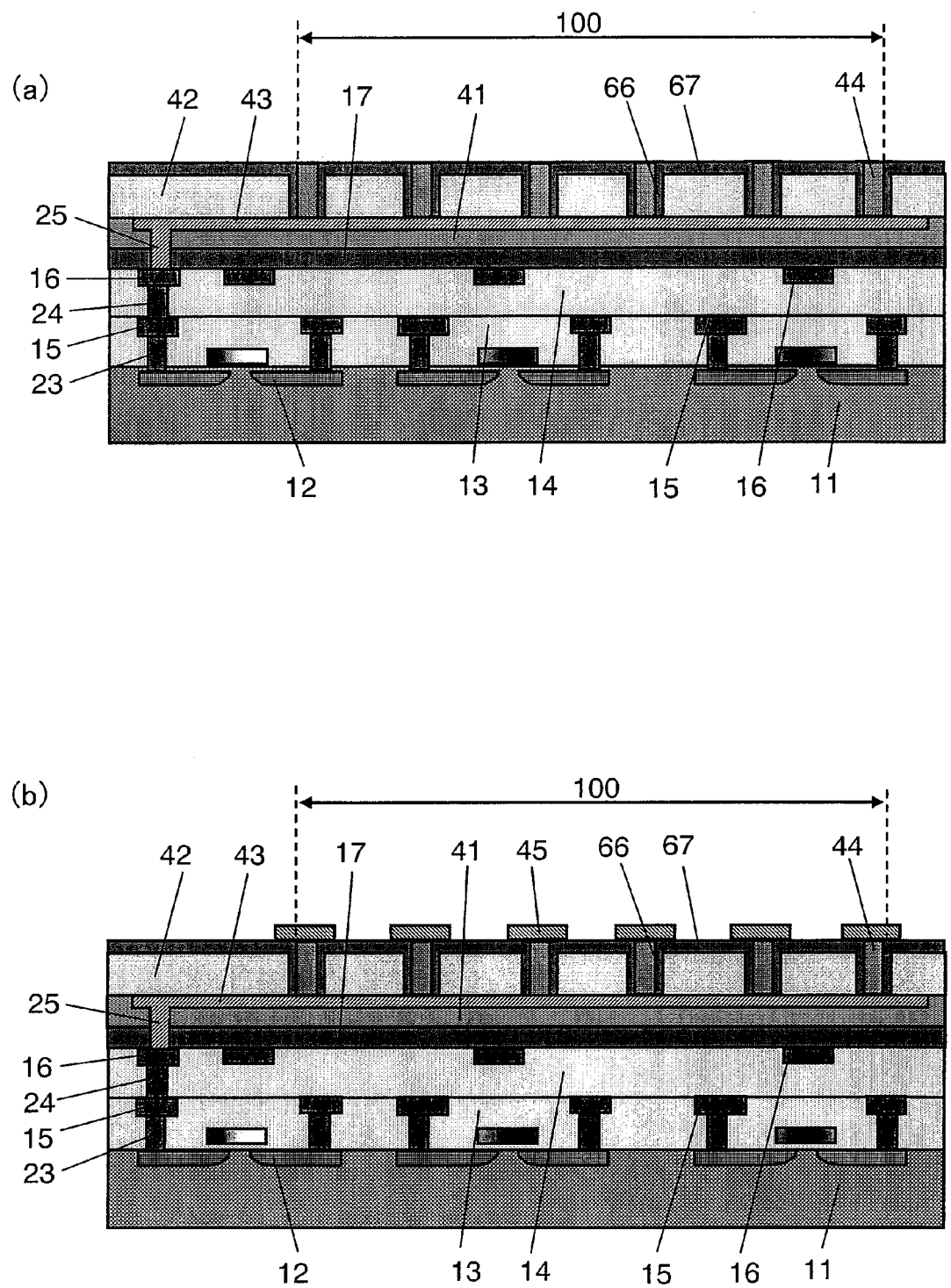
FIG. 13 is a cross-sectional view of major steps for explaining the manufacturing method of the nonvolatile semiconductor memory apparatus according to Embodiment 3 of the present invention.
Figure 14:
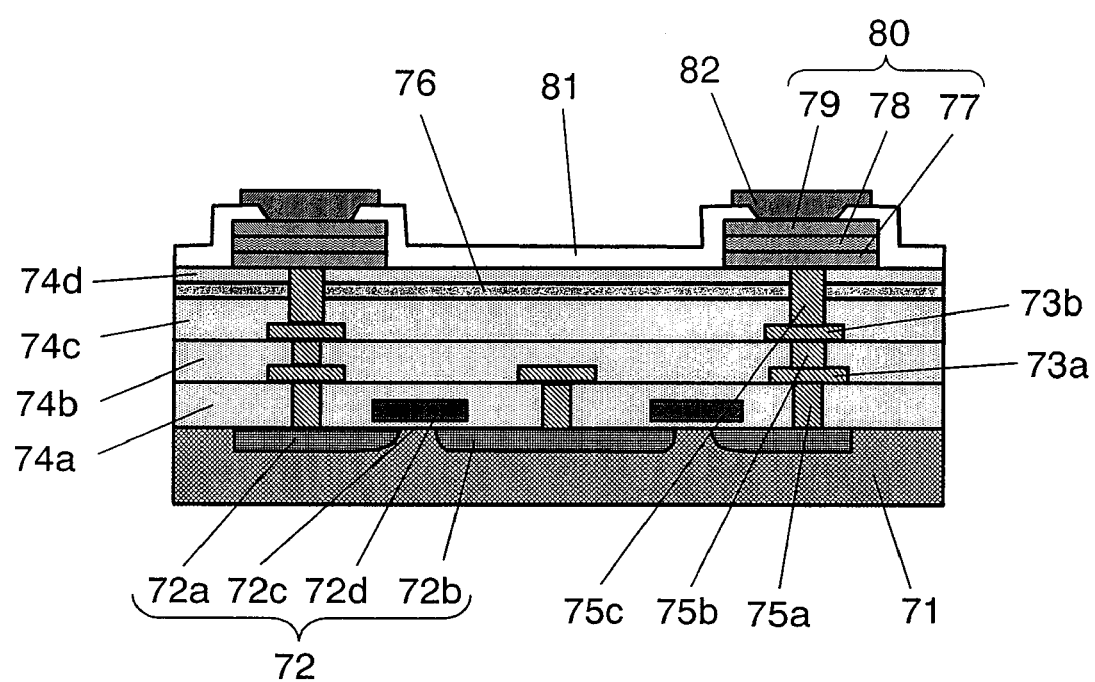
FIG. 14 is a cross-sectional view of the conventional non-volatile semiconductor memory apparatus using a ferroelectric substance as a memory portion.

FIGS. 12 and 13 are cross-sectional views of major steps for explaining a manufacturing method of the nonvolatile semiconductor memory apparatus 65 of this embodiment.

As shown in FIG. 12(a), the contact holes 48 are formed in the interlayer insulating layer 42 as in the step for the nonvolatile semiconductor memory apparatus 40 of Embodiment 2. This step and the preceding steps are identical to those for the nonvolatile semiconductor memory apparatus 40 of Embodiment 2.

Then, as shown in FIG. 12(b), a thin film 68 which serves as the oxygen barrier separating films 66 and the second oxygen barrier layers 67 is formed. For the thin film 68, the material may be selected from the above materials. To allow the thin film 68 to adhere to the side wall of the contact hole 48 in a sufficient amount, the thin film 68 is desirably deposited by the CVD process. This makes it possible to interpose the oxygen barrier separating film 66 inside the contact hole 48 between the resistance variable layer 44 to be formed in later step and the interlayer insulating layer 42.

Then, as shown in FIG. 12(c), etching is conducted to mainly remove a portion of the thin film 68 adhering onto the bottom portions of the contact holes 48. In this case, the portion of the thin film 68 adhering onto the bottom portions of the contact holes 48 can be removed by primarily using anisotropic etching. Although some of the portion of the thin film 68 adhering onto the surface of the interlayer insulating layer 42 is etched, the thin film 68 is formed to adhere onto the surface of the interlayer insulating layer 42 with a large thickness in the step for forming the thin film 68, and therefore is left in a sufficient amount even through the etching is conducted so as to expose the lower electrode wires 43. As a result of the etching, the oxygen barrier separating films 66 are formed on the side walls of the contact holes 48 and the second oxygen barrier layers 67 are formed on the interlayer insulating layer 42.

Then, as shown in FIG. 13(a), the resistance variable layer 44 is embedded to fill the contact hole 48. This is formed as follows. To be specific, a thin film which serves as the resistance variable layer 44 is formed to have a thickness to an extent that each contact hole 48 is fully filled with the thin film, and thereafter the CMP is conducted, thereby embedding the resistance variable layer 44 to fill the contact hole 48. In the step for embedding the resistance variable layer 44, the resistance variable layers 44 are formed like islands so as to respectively correspond to the regions where the lower electrode wires 44 and the upper electrode wires 45 to be formed in the later step cross each other. Therefore, the region surrounding by the shortest line and in the annular form the outer periphery of the resistance variable layers 44 arranged at the outermost side corresponds to the above memory portion forming region 100.

Then, as shown in FIG. 13(b), the stripe-shaped upper electrode wires 45 are formed on the second oxygen barrier layer 67 such that the upper electrode wires 45 are respectively connected to the resistance variable layers 44 and respectively cross the lower electrode wires 43. In this step, as shown in FIG. 11, each memory portion 47 is constituted by the lower electrode wire 43a, the resistance variable layer 44 and the upper electrode wire 45a in the region where the lower electrode wire 44 and the upper electrode wire 45 cross each other. The oxygen barrier layer 17 extends continuously below the memory portion forming region 100 in which the memory portions 47 are arranged. That is, in the step for forming the oxygen barrier layer 17, the oxygen barrier layer 17 is formed to extend continuously over at least the entire of the memory portion forming region 100.

Then, by forming the wire insulating layer 46 on the second oxygen barrier layer 67 including the upper electrode wires 45, the nonvolatile semiconductor memory apparatus 65 of this embodiment is obtained. As the materials for the oxygen barrier layer 17, the lower electrode wires 43, the resistance variable layers 44, the interlayer insulating layer 42, the wire insulating layers 41 and 46, the upper electrode wires 45, the active element forming region and the wire forming region, etc, the materials described in Embodiment 2 may be used, and description therefor is omitted.

Through the above step, the nonvolatile semiconductor memory apparatus 65 having a configuration in which the oxygen barrier separating films 66 are provided on the side walls of the contact holes 48 and the resistance variable layers 44 are embedded can be manufactured.

Since the nonvolatile semiconductor memory apparatus 65 is manufactured with the above method, the semiconductor electrode wires 16 are connected to the upper and lower electrode wires 43 and 45 in the regions different from the region where the resistance variable layers 44 are provided. Therefore, it is possible to attain a nonvolatile semiconductor memory apparatus in which the embedded electric conductors 25 are not subjected to oxidation and a contact failure does not occur. Further, since the oxygen barrier separating films 66 cover the side walls of the resistance variable layers 44, the interlayer insulating layer 42 is not oxidized even when the interlayer insulating layer 42 is formed of, for example, the low dielectric constant film which has low resistance to oxidation. That is, a capacity between the wires is reduced, and thus a high-speed operation of the apparatus is attainable.

The nonvolatile semiconductor memory apparatus 65 of this embodiment may have a layer structure as in the nonvolatile semiconductor memory apparatus 50 shown in FIG. 10 as modification thereof. The configuration, the manufacturing method thereof, and the like for the layer structure are obtained by combining the nonvolatile semiconductor memory apparatus 65 of this embodiment with the nonvolatile semiconductor memory apparatus 50 shown in FIG. 10, and therefore description thereof is omitted.

Numerous modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A nonvolatile semiconductor memory apparatus of the present invention is configured such that an oxygen barrier layer extending continuously disconnects a wire forming region provided on a semiconductor substrate from a memory portion forming region provided with a plurality of memory portions using a resistance variable layer whose resistance changes reversibly by application of electric pulses. Therefore, the nonvolatile semiconductor memory apparatus of the present invention attains a nonvolatile semiconductor memory apparatus which is stable in memory characteristics and has a high manufacturing yield. The nonvolatile semiconductor memory apparatus is useful in fields of portable terminal devices, etc.

The invention claimed is:

1. A nonvolatile semiconductor memory apparatus comprising:
   a semiconductor substrate;
   an active element forming region provided on said semiconductor substrate and including a plurality of active elements;
   a wire forming region which is provided on said active element forming region to electrically connect the active elements and includes two or more semiconductor electrode wires and a wire region insulating layer covering the semiconductor electrode wires;
   a memory portion forming region which is provided above said wire forming region and provided with memory portions arranged in matrix, a resistance value of each of the memory portions changing according to electric pulses applied, said memory portion forming region including an upper electrode wire, a resistance variable layer, a lower electrode wire, and a memory region insulating layer covering the upper electrode wire, the resistance variable layer, and the lower electrode wire;
   wherein the lower electrode wires are formed in a stripe shape above said wire forming region via a first insulating layer serving as the memory region insulating layer; the resistance variable layers are embedded to fill contact holes formed in an interlayer insulating layer serving as the memory region insulating layer such that the resistance variable layers are respectively connected to the lower electrode wires; the upper electrode wires are formed in a stripe shape on the interlayer insulating layer such that the upper electrode wires are respectively connected to the resistance variable layers and respectively cross the lower electrode wires; the memory portions are each constituted by the lower electrode wire, the resistance variable layer, and the upper electrode wire corresponding to a region where the lower electrode wire and the upper electrode wire cross each other;
   a first oxygen barrier layer which is interposed between said memory portion forming region and said wire forming region and extends continuously over an entire of said memory portion forming region to block oxygen for at least the entire of said memory portion forming region; and
   a second oxygen barrier layer provided between the interlayer insulating layer and the upper electrode wires
   wherein an insulating material used for the wire region insulating layer has a dielectric constant smaller than a dielectric constant of an insulating material used for the memory region insulating layer;
   when the resistance variable layers are arranged like islands to respectively correspond to the memory portions in a planar view, a region surrounding by a shortest line and in an annular form an outer periphery of the resistance variable layers arranged at an outermost side corresponds to said memory portion forming region.

2. The nonvolatile semiconductor memory apparatus according to claim 1, further comprising:
   an oxygen barrier separating film provided inside each of the contact holes such that said oxygen barrier separating film is interposed between the resistance variable layer and the interlayer insulating layer.

3. The nonvolatile semiconductor memory apparatus according to claim 2,
   wherein said second oxygen barrier layer is made of a material forming said oxygen barrier separating film.

4. The nonvolatile semiconductor memory apparatus according to claim 1,
   wherein plural layers of the memory portion forming regions are stacked to form a layer structure above said wire forming region.

5. The nonvolatile semiconductor memory apparatus according to claim 1,
   wherein the lower electrode wires and the upper electrode wires are respectively connected to the semiconductor electrode wires in a region different from said memory portion forming region.

6. The nonvolatile semiconductor memory apparatus according to claim 1, further comprising:
   wire insulating layers which are respectively provided between adjacent lower electrode wires and between adjacent upper electrode wires and are serving as the memory region insulating layer;
   wherein an insulating material used for at least one of the wire insulating layers has a dielectric constant smaller than a dielectric constant of an insulating material used for the interlayer insulating layer.

7. The nonvolatile semiconductor memory apparatus according to claim 6,
   wherein the lower electrode wires are embedded in the first insulating layer such that main surfaces thereof are exposed, and the first insulating layer is said wire insulating layer provided between adjacent lower electrodes.

8. The nonvolatile semiconductor memory apparatus according to claim 1,
   wherein at least one of an interval between adjacent lower electrode wires and an interval between adjacent upper electrode wires is smaller than a thickness of the interlayer insulating layer.

9. The nonvolatile semiconductor memory apparatus according to claim 1,
   wherein the resistance material layer is made of a material which is an oxide containing iron.

10. The nonvolatile semiconductor memory apparatus according to claim 1,
    wherein the interlayer insulating layer is silicon oxide layer formed using a tetraethyloxysilane-ozone based gas, or fluorosilicate glass.

11. The nonvolatile semiconductor memory apparatus according to claim 6,
    wherein the wire insulating layer is silicon carbon nitride layer or silicon oxycarbite layer.

12. The nonvolatile semiconductor memory apparatus according to claim 1,
    wherein the first oxygen barrier layer is a silicon nitride layer, a silicon oxynitride layer, an alumina layer, a tantalum oxide layer, a titanium oxide layer, a hafnium oxide layer or a zircon oxide layer.

13. A method of manufacturing a nonvolatile semiconductor memory apparatus comprising:
    a step for forming an active element forming region including a plurality of active elements on a semiconductor substrate;
    a step for forming a wire forming region on the active element forming region to electrically connect the active elements such that plural layers of two or more semiconductor electrode wires and a wire region insulating layer covering the semiconductor electrode wires are formed;

a step for forming a first oxygen barrier layer on the wire forming region; and a step for forming a memory portion forming region on the first oxygen barrier layer, including forming lower electrode wires, forming resistance variable layers on the lower electrode wires, forming upper electrode wires on the resistance variable layers; and forming a memory region insulating layer covering the lower electrode wires, the resistance variable layers and the upper electrode wires to arrange memory portions in matrix, a resistance value of the memory portions changing according to electric pulses applied; wherein said step for forming the memory portion forming region includes: a step for forming a first insulating layer serving as the memory region insulating layer; a step for forming stripe-shaped lower electrode wires on the first insulating layer; a step for forming an interlayer insulating layer serving as the memory region insulating layer so as to cover the lower electrode wires and the first insulating layer; a step for forming contact holes above the first oxygen barrier layer and in the interlayer insulating layer on the lower electrode wires such that the lower electrode wires are exposed; a step for embedding the resistance variable layers to fill the contact holes such that the resistance variable layers are respectively connected to the lower electrode wires; and a step for forming stripe-shaped upper electrode wires on the interlayer insulating layer such that the upper electrode wires are respectively connected to the resistance variable layers and respectively cross the lower electrode wires; a step for forming a second oxygen barrier layer between the interlayer insulating layer and the upper electrode wires;

wherein in said step for forming the first oxygen barrier layer, the first oxygen barrier layer is formed to extend continuously over at least an entire of the memory portion forming region;

an insulating material used for the wire region insulating layer has a dielectric constant smaller than a dielectric constant of an insulating material used for the memory region insulating layer;

when the resistance variable layers are formed like islands so as to respectively correspond to regions where the lower electrode wires respectively cross the upper electrode wires in said step for embedding the resistance variable layer, a region surrounding by a shortest line and in an annular form an outer periphery of the resistance variable layers arranged at an outermost side corresponds to the memory portion forming region.

14. The method of manufacturing the nonvolatile semiconductor memory apparatus according to claim 13, wherein the lower electrode wires and the upper electrode wires are connected to the semiconductor electrode wires in a region different from the memory portion forming region.

15. The method of manufacturing the nonvolatile semiconductor memory apparatus according to claim 13, further comprising:

a step for repeating the step for forming the memory portion forming region to stack above the wire forming region plural layers of the memory portion forming regions.

* * * * *